United States Patent
Pfingsten et al.

(10) Patent No.: US 7,636,615 B2
(45) Date of Patent: Dec. 22, 2009

(54) POWER CONTROL SYSTEM

(75) Inventors: Thomas Robert Pfingsten, Winona, MN (US); Donald Leo Commare, La Crescent, MN (US); Craig Richard Dennis, Lewiston, MN (US); Leon J. McNutt, Houston, MN (US); Theodore Thomas Von Arx, La Crescent, MN (US); Keith Douglas Ness, Winona, MN (US); Robert Allen Pape, Winona, MN (US); John Frederic Lemke, Houston, MN (US); Larry Emil Tiedemann, Winona, MN (US); Stanton Hopkins Breitlow, Winona, MN (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 572 days.

(21) Appl. No.: 11/219,473

(22) Filed: Sep. 2, 2005

(65) Prior Publication Data

US 2006/0052905 A1 Mar. 9, 2006

Related U.S. Application Data

(60) Provisional application No. 60/607,342, filed on Sep. 3, 2004.

(51) Int. Cl.
*G06F 19/00* (2006.01)
(52) U.S. Cl. ..................... 700/286; 307/113
(58) Field of Classification Search .............. 700/286; 361/42, 723; 323/211, 295; 307/31
See application file for complete search history.

(56) References Cited

U.S. PATENT DOCUMENTS

| 3,894,243 | A | * | 7/1975 | Edelman et al. ............. 307/400 |
| 5,272,585 | A | | 12/1993 | Gibbs |
| 6,737,761 | B2 | * | 5/2004 | Ishida et al. .................. 307/41 |
| 7,245,008 | B2 | * | 7/2007 | Lee ............................. 257/686 |
| 2003/0175566 | A1 | * | 9/2003 | Fisher et al. .................. 429/22 |
| 2004/0088083 | A1 | | 5/2004 | Davis et al. |
| 2006/0086873 | A1 | * | 4/2006 | Chen ........................ 248/206.5 |

FOREIGN PATENT DOCUMENTS

| JP | 63-028238 | 2/1988 |
| JP | 05-284635 | 10/1993 |
| JP | 09-331301 | 11/1997 |
| JP | 11-235021 | 8/1999 |
| WO | WO 2004/023624 A1 | 3/2004 |

OTHER PUBLICATIONS

Japanese Office Action Dated Mar. 3, 2009.

* cited by examiner

*Primary Examiner*—Kidest Bahta
(74) *Attorney, Agent, or Firm*—Brinks Hofer Gilson & Lione

(57) ABSTRACT

A power control assembly for use in an integrated power control system has a base with a housing that defines a cavity adapted for receiving a power switch. The control assembly includes a control module configured for generating control signals for controlling the power switch for selectively providing power to a load. A control housing houses the control module and is adapted to be releasably coupled to the base housing and is configured for electrically coupling to control couplers on the base housing for providing the generated control signals to the power switch within the housing cavity upon coupling the control housing to the base housing.

25 Claims, 20 Drawing Sheets

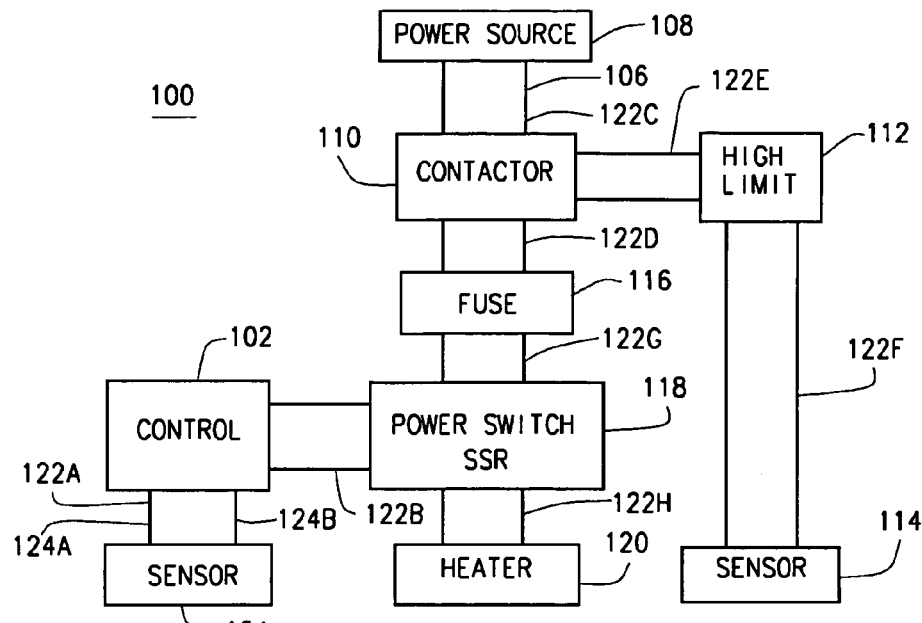
FIG. 1
PRIOR ART
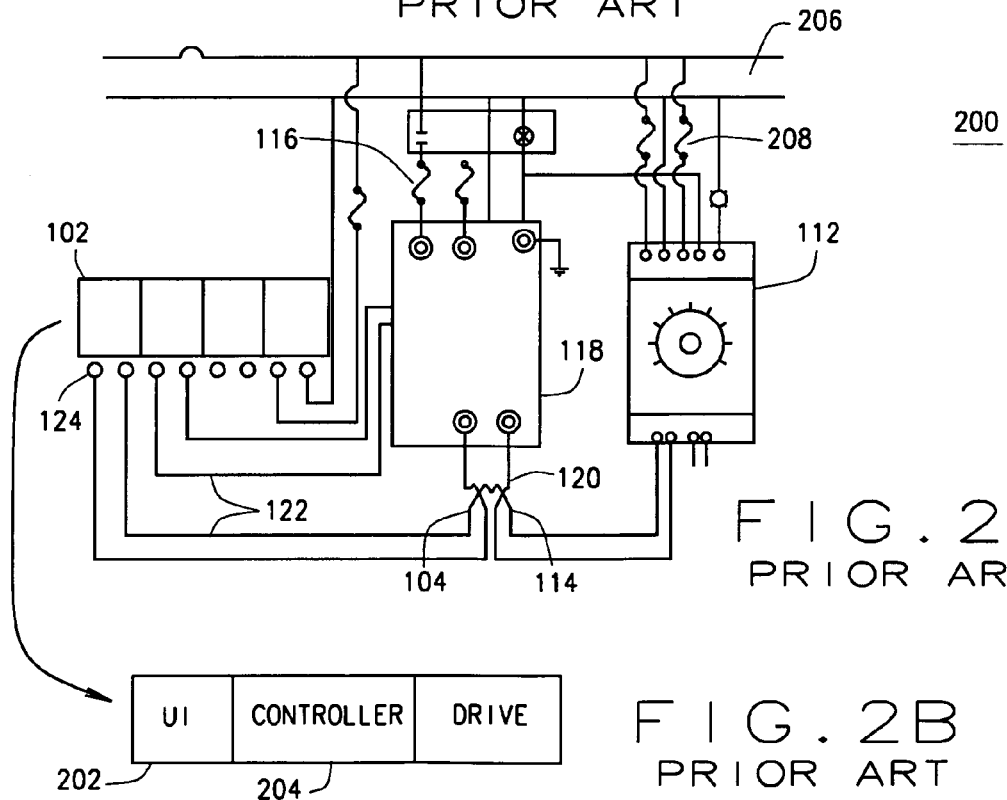
FIG. 2A
PRIOR ART
FIG. 2B
PRIOR ART

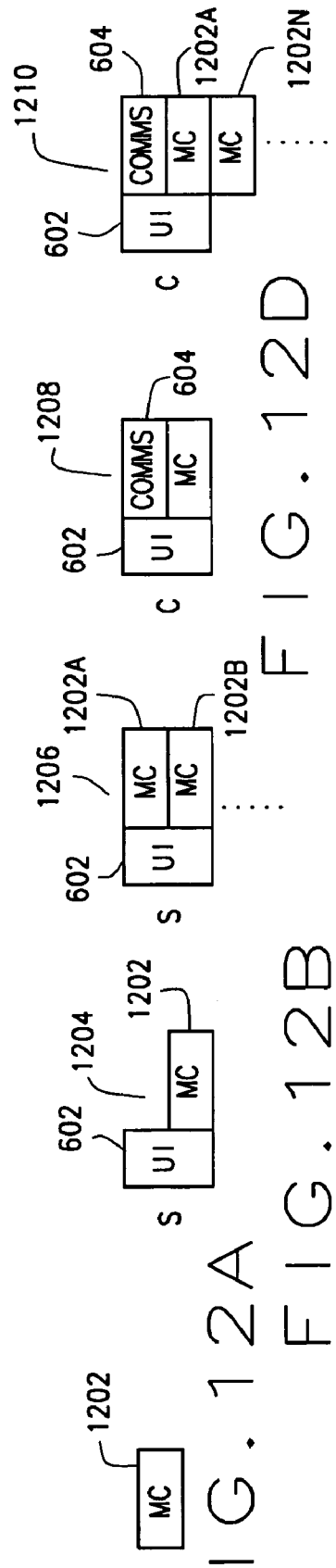

POWER CONTROL SYSTEM

CROSS-REFERENCE TO RELATED APPLICATIONS

This application claims the benefit of U.S. Provisional Application No. 60/607,342, filed on Sep. 3, 2004. This application is also related to U.S. patent application Ser. No. 11/219,472, filed Sep. 2, 2005, entitled INTEGRALLY COUPLED POWER CONTROL SYSTEM HAVING A SOLID STATE RELAY; and PCT patent application No. PCT/US05/32150, filed Sep. 2, 2005, entitled POWER CONTROL SYSTEM. The disclosure of the above applications are incorporated herein by reference.

FIELD OF THE INVENTION

The invention relates generally to a control system, and, more particularly, to a control system for controlling power to a power-receiving load.

BACKGROUND

A control system for controlling the power provided to a power-receiving load is traditionally produced and deployed on a discrete component basis. Discrete components are selected and combined for the particular application or receiving load.

FIG. 1 illustrates a typical exemplary power control arrangement composed of a variety of discrete components. These can include a control system 102 with an associated control sensor 104, an input 106 for receiving power from a power source 108, a contactor 110 for receiving the power from the power source 108, a limit 112 with an associated limit sensor 114, a fuse 116, a power switch 118 (shown as a solid state relay), and a power load 120 (shown as a heating element). As illustrated, each of the various discrete components is combined and hard-wired to meet the needs of a particular user process control application constituting a power control system 100. As indicated in FIG. 1, for this typical thermal loop power control application, the combination of discrete components for a single power loop requires 7 discrete components 102, 104, 110, 112, 114, 116, and 118, with 16 wires 122A-H and 24 wiring connections, two for each of 16 wires 122A-H, and labeled, for example as 124A and 124B, for the two wires 122A. However, other discrete components can also be included such as a timer, a pressure sensing component, a power monitor, etc. (none of which are shown in FIG. 1). The addition of each of these components will often require 2 wires 122 and possibly 4 connections 124 to terminate both ends of each wire and can require the rewiring of previous wires in order to reconfigure the wiring between the various components.

FIG. 2 illustrates another example of a typical power control arrangement 200 for controlling power for a thermal loop application. As shown, the control 102 can include a user interface 202 and controller 204 and have 6 connections 124 to 6 wires 122. A limit contactor 110 can be positioned between a power supply bus 206 that is coupled to a power supply 108 (not shown in FIG. 2) and then wired to a semiconductor fuse 116 such as a fast blow fuse. The fuse 116 provides a fusible connection to a power switch 118 that can be any type of power switch, but is often a semiconductor-based switch such as solid state relay (SSR), a TRIAC, or a silicon controller rectifier (SCR), by way of example. The power switch 118 provides power to a power load 120 such as a heater for heating a user application. A process or application sensor 104 senses the temperature of the heater 120 in the user application and provides feedback to the controller 204 for feedback control of the powering of the power load 120, such as a heater. Additionally, as discussed above, the limit contactor 110 receives input from a limit component 112 that includes a limit sensor 114. The limit sensor 114 is also located in proximity to the heater 120. The limit system comprised of the limit contactor 110, the limit component 112, and the limit sensor 114, monitors the operation of the heater 120 to protect the heating element of the heater 120 from destruction, failure or impairment. The limit component 112 receives power from the power bus 206 through a set of device fuses 208. The limit component 112 determines when the limit sensor 114 has detected a heater condition and signals to the limit contactor 110 over a separate wire, to initiate a limit action in the limit contactor 110, thereby preventing power from passing to the power switch 118 and therefore to the heater 120. As is also indicated in FIG. 2, each discrete component within the power control system 200 requires separate wiring 122 and numerous connections 124. Additionally, such wiring 122 and discrete component installations are often confusing to installers and wiring mistakes often result. Common mistakes made during installation include incorrect termination of leads to terminals resulting in circuit shorting or opens, poor compression of terminals to leads resulting in potential high temperatures at terminals, electrical magnetic interference with other components, or electromagnetic emissions.

As shown in FIG. 3, other common discrete components also include current transformers 302 or sensors or other measurement devices for measuring one or more characteristics of a power control user application. As shown in FIGS. 3A and 3B, one or more current transformers 302 can be positioned in the power supply line 304 from the power switch 118 to the heater power load 120 to sense current supplied to the heating element. Each current transformer 302 measures a current 306 in the power supply line 304 which is provided to a current transformer controller (not shown) which is yet another discrete component that requires installation, wiring and connections for installation into the user application. In some applications, this wiring requires the breaking of the power line 304 to introduce the current transformer 302 resulting in another opportunity for wiring mistakes.

Similarly, FIG. 4 illustrates another discrete component control system 400, having a control switch 118, such as a relay, is electrically located between the power load 120 and the contactor 110. The control relay 118 receives a control signal 402 from the controller 102 over a separately wired control lead 404. The control relay 118 operates in response to a control signal 402 from the controller 102 to provide power to the contactor 110 and therefore to the power load 120. Again, additional discrete components and specialized wiring are typically required for another user application.

Generally, typical power control installations require specialized selection of the discrete components, customized mounting and wiring for each component and feature, and multiple connections. Additionally, any changes, additions, modifications, and replacements require disconnection and reconnection of various wire leads, yet again increasing the opportunity for wiring mistakes.

As such, existing power control implementations and installations are often complex and costly to install. Such complexity and costs limit their application or limit the functionality included in a particular user application. For example, a limit control for over-voltage or a power monitoring component are not included in many applications when not required by a regulation due to the required added complexity and/or installed cost.

SUMMARY OF THE INVENTION

The present invention generally relates to a power control system that includes an integrated operational design. The following presents a summary of the power control system, according to some embodiments of the invention, in order to provide a basic understanding of one or more aspects of the invention. This summary is not an extensive overview, and is neither intended to identify key or critical elements of the invention, nor to delineate the scope thereof. Rather, the primary purpose of the summary is to present some aspects of the invention in a simplified form as a prelude to the more detailed description presented later.

In one aspect of the invention, a power control system includes an integration coupling mechanism for mechanical and electrical coupling of a plurality of power control system components and a communication link configured for providing a communication among a plurality of power control system components utilizing the coupling mechanism. A power switch component is adapted for coupling by the unit integration coupling mechanism and selectively providing electrical energy to a load the power switch component including a power supply interface for receiving power from a power supply, a power load interface for providing, at least a portion, of the received supply power to the power load, and a power switch communication interface configured to communicate over the communication link. The power switch component adapted to the coupling mechanism for mechanical, electrical and communication coupling. A power controller component is configured for controlling the power switch component and includes a controller communication interface for communicating over the communication link to the power switch component.

In another aspect of the invention, a power control system has a plurality of components and includes a system control component for generating a switch control signal and a limit control component for receiving a sensed limit operating characteristic and generating a limit control signal as a function of the sensed limit operating characteristic. A communication link is configured for providing a communication between two of the plurality of power control system components. A power control unit includes a plurality of power control components and a unit integration coupling mechanism for mechanical and electrical coupling of the components of the power control unit. The power control unit has a power supply interface for receiving power from a power supply, a power load interface for providing, at least a portion of, the received supply power to a power load, and a power switch component for selectively providing electrical energy to a load responsive to the switch control signal and adapted to the coupling mechanism. The power switch component includes a power switch communication interface configured to communicate with the communication link and a limit component for controlling the delivery of the supply power to the power switch component responsive to the limit control signal.

In yet another aspect of the invention, a power control system has a plurality of components including a first control component having a plurality of first component versions, a second control component having a plurality of second component versions, and a system integration coupling mechanism for mechanical, electrical, and communication coupling the first component and the second component, wherein each of the first component versions being operable with each of the second component versions when coupled with the system integration coupling mechanism.

In still another aspect of the invention, a power control system includes a plurality of control system components and has a system integration coupling mechanism for mechanical, electrical, and communication coupling of a plurality of components into the power control system, a plurality of self-identifying components and a plurality of self-configuring components. The self-configuring components are configured for self-configuring in response to a received self-identification of another one of the plurality of components.

In another aspect of the invention, a method of controlling power in a power control system having a plurality of power control component is provided. The method includes generating self-identification of each component within a power control system, comparing the identity of each component as self-identified to a at least one of a predetermined configuration and a profile, and reconfiguring a characteristic of one or more components responsive to the comparing.

In still another aspect of the invention, a power control system includes a base having a housing configured for releasably receiving a control unit and a cavity within the housing for receiving a power switch. The base includes an input power terminal for coupling to an input power source, an output power terminal for coupling to a power receiving load, and coupling fixtures for fixedly and electrically coupling to input and output power terminals and control terminals of the received power switch. A control unit is configured to control the power switch for selectively providing, at least a portion of, the power received at the input power terminal to the output power terminal. The control unit has a housing adapted to be releasably coupled to the base housing and the control unit and base are each configured to electrically couple the control unit to the control terminals of the received power switch as a function of the control unit being coupled to the base.

In another aspect of the invention, a power control system includes a base having a housing for releasably receiving a control unit and defines a first cavity for receiving a power switch, a second cavity for receiving a limit switch, an input power terminal, an output power terminal coupled to receive switched power from an output terminal a received power switch, and control couplers for coupling to an input and an output control terminal of the received power switch, and a plurality of electrical connections. A limit switch is positioned within the second cavity and is coupled by a portion of the electrical connections in series with the input power terminal, an input terminal of the received power switch received within the first cavity, and the output power terminal. A control unit is configured to generate contactor control signals to the limit switch and switch control signals to the power switch for selectively providing, at least a portion of, the power received at the input power terminal to the output power terminal. The control unit has a housing adapted to be releasably coupled to the base housing and the control unit and base are configured to electrically couple the control unit to the control terminals of the received power switch as a function of the control unit being releasably coupled to the base. The control unit includes a limit component having a threshold limit function and the contactor control signals are generated as a function of the threshold limit function.

In still another aspect of the invention, a power control assembly for use in an integrated power control system has a base with a housing that defines a cavity adapted for receiving a power switch. The control assembly includes a control module configured for generating control signals for controlling the power switch for selectively providing power to a load. A control housing houses the control module and is adapted to be releasably coupled to the base housing and is configured for electrically coupling to control couplers on the base housing for providing the generated control signals to the power switch within the housing cavity upon coupling the control housing to the base housing.

In yet another aspect of the invention, a method of assembling a power control unit includes inserting a power switch into a cavity defined by a base having housing, coupling an input power terminal to an input terminal of the power switch, coupling an output power terminal to an output terminal of the power switch, coupling a first control attachment fixture to a first control terminal of the power switch and coupling a second control attachment fixture to a second control terminal of the power switch. The method also includes inserting a control unit having a control housing onto the base housing where the control housing and the base housing are each configured for releasably coupling the inserted control unit to the base. The method provides that the inserting a control unit includes compressively coupling the control unit to the first control attachment fixture and the second control attachment fixture and completing an electrical connection between the control unit and each of the control terminals of the power switch.

Further aspects of the present invention will be in part apparent and in part pointed out below. It should be understood that various aspects of the invention may be implemented individually or in combination with one another. It should also be understood that the detailed description and drawings, while indicating certain exemplary embodiments of the invention, are intended for purposes of illustration only and should not be construed as limiting the scope of the invention.

BRIEF DESCRIPTION OF THE DRAWINGS

The present invention will become more fully understood from the detailed description and the accompanying drawings.

FIG. 1 is a block diagram illustrating one typical discrete component power control system for a thermal loop.

FIG. 2A is a circuit diagram of another typical discrete component controller for regulating a power switch.

FIG. 2B is a block diagram of the functional elements of a typical power controller.

FIG. 12 illustrates block diagrams of various user interfaces and scalable control systems according to various exemplary embodiments of the invention.

Corresponding reference characters indicate corresponding parts throughout the several views of the drawings.

DETAILED DESCRIPTION OF EXEMPLARY EMBODIMENTS

Figure 3A:
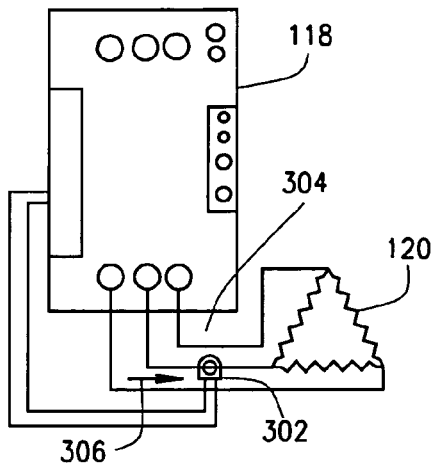
FIGS. 3A and 3B are circuit diagrams illustrating a power control system for providing power to a heater that includes a current transformer for measuring the current of the provided power to the heater.
Figure 3B:
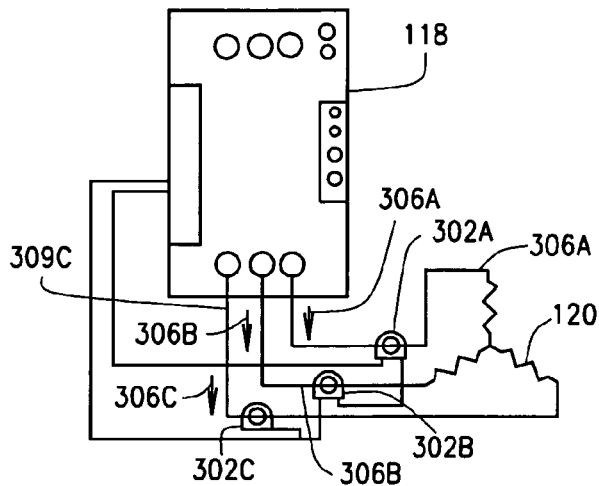
Figure 4:
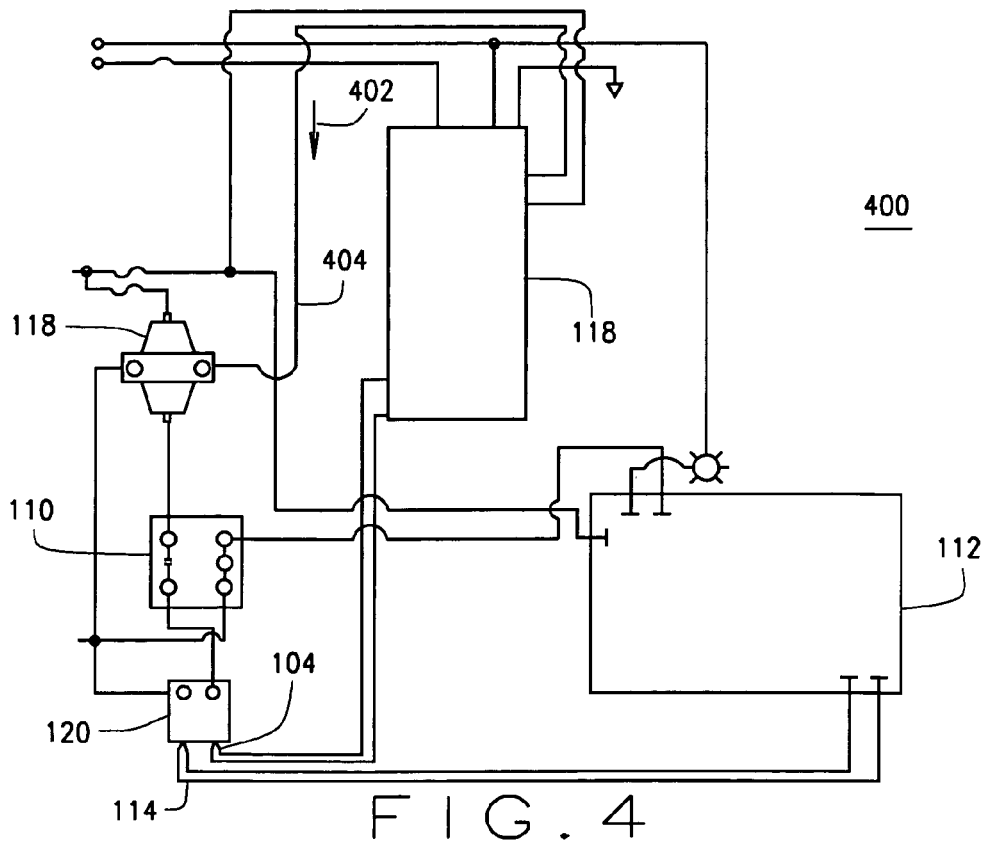
FIG. 4 is a wiring diagram of a typical discrete component heater power control system.

The following description is merely exemplary in nature and is in no way intended to limit the invention, its applications, or uses.

One embodiment of the invention is a power control system having a power control unit that includes a plurality of power control components. The system includes a unit integration coupling mechanism for mechanical and electrical coupling of a plurality of components into a power control unit. The system also includes a communication link configured to provide a communication among a plurality of power control system components utilizing the coupling mechanism. The system further includes a power switch component adapted for coupling by the unit integration coupling mechanism. The power switch component selectively provides electrical energy to a power load. The power switch includes a power supply interface for receiving power from a power supply, a power load interface for providing, at least a portion, of the received supply power to the power load. It also includes a power switch communication interface configured to communicate over the communication link. The power switch component is adapted to the coupling mechanism for mechanical, electrical and communication coupling. The system also includes a power controller component for controlling the power switch component. The power controller component has a controller communication interface for communicating over the communication link to the power switch component Another embodiment of the invention includes a power control system having a plurality of components, including a system control component for providing a control signal. The system also includes a communication link configured for providing a communication between at least two of the plurality of power control system components. The system further includes a power control unit including a plurality of power control components and a unit integration coupling mechanism for mechanical and electrical coupling of the components of the power control unit. The power control unit includes a power supply interface for receiving power from a power supply and a power load interface for providing, at least a portion of, the received supply power to a power load. A power switch component selectively provides electrical energy to a power load responsive to the control signal and adapted to the coupling mechanism. The power switch component includes a power switch communication interface configured to communicate with the communication link and a limit component for controlling the delivery of the supply power to the power switch component. The limit component includes a limit sensor for sensing a limit operating characteristic. The delivery of the supply power to the power switch component being responsive to the sensed limit operating characteristic.

In yet another embodiment, the invention includes a power control system including a system integration coupling mechanism for mechanical, electrical, and communication coupling of a plurality of components into the power control system. The system also includes a plurality of self-identifying components and a plurality of self-configuring components. The self-configuring of each component being responsive to a received self-identification of another one of the plurality of components.

In still another embodiment, the invention includes a power control system including at least a first and second control component, a first control component having a plurality of first component versions and a second control component having a plurality of second component versions. Also included is a system integration coupling mechanism for mechanical, electrical, and communication coupling the first component and the second component, wherein each of said first component versions being operable with each of said second component versions when coupled with said system integration coupling mechanism.

Another embodiment of the invention includes a power control system including a contactor power switch for selectively providing power from a power supply to a power load. The system also includes a limit component with a threshold limit for providing a limit switching function as a function of the threshold limit. The limit component and the contactor power switch are configured as an integrated switch and limit component of the power control system. The system further includes a system integration coupling mechanism for mechanical, electrical, and communications coupling of the integrated contactor switch and limit component into the power control system. The system also includes a control component that provides control signals to the switch and limit component for controlling an operation of the switch and limit component.

In yet another embodiment, the invention is a method of controlling power in a power control system having a plurality of power control component. The method includes generating self-identification of each component within a power control system. The method also includes comparing the identity of each component as self-identified to at least one of a predetermined configuration and a profile and reconfiguring a characteristic of one or more components responsive to the comparing.

Figure 5A:
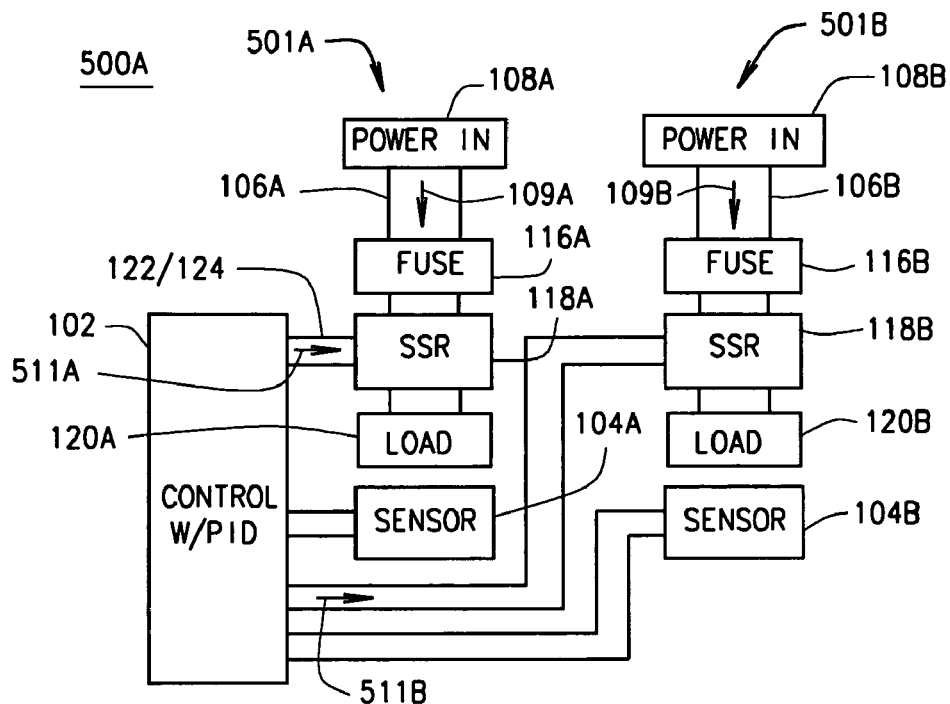
FIG. 5A is a block wiring diagram of a typical power control system.
Figure 5B:
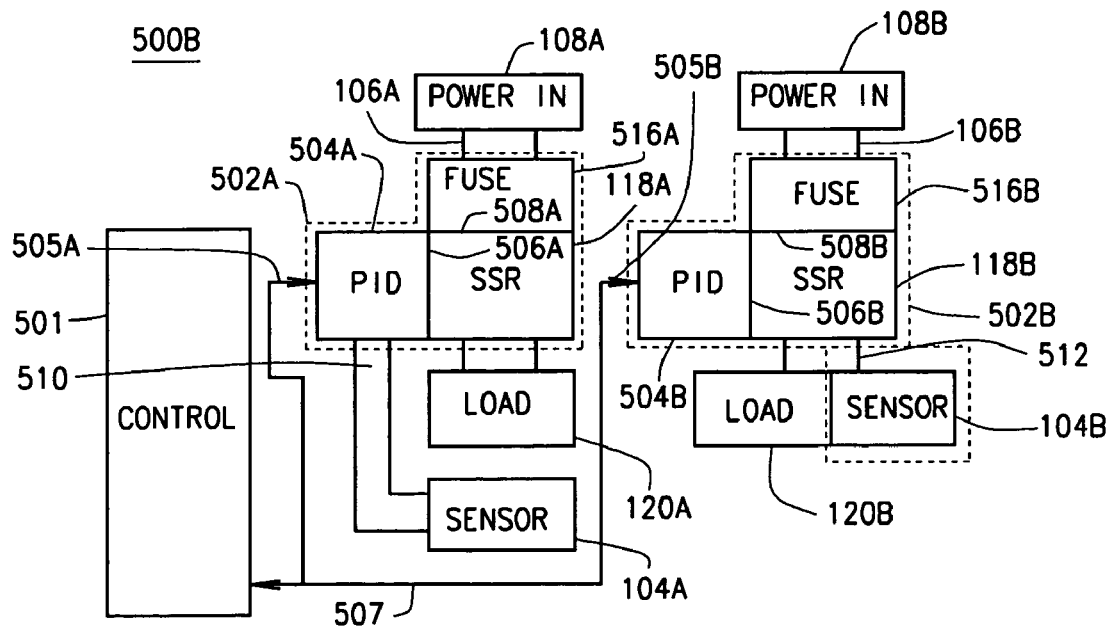
FIG. 5B is a block wiring diagram of a power control system according to one exemplary embodiment of the invention.

Referring now to the figures, FIGS. 5A and 5B illustrate a comparison of the typical power control system and a power control system according to one exemplary embodiment of the invention. Similar to the power control system 100 of FIG. 1, a power control system 500A of FIG. 5A includes a first discrete power control assembly 501A that receives supply power 109A from power supply 108A via the power supply input 106A and a second discrete power control assembly 501B receives supply power 109B from power supply 108B. Fuses 116A and 116B (or any similar fuse link such as a circuit breaker, by way of example) receive the input power 109A and 109B, respectively and provide the received power to the coupled power switches 118A and 118B. The power switches 118A and 118B are discretely coupled to the controller 102 which is equipped with a control component, such as a proportional integral and derivative (PID) control algorithm. The controller 102 provides control signals 511A and 511B to the power switches 118A and 118B, respectively, for selectively controlling the switching operation thereof. The controller 102 is coupled to sensors 104A and 104B and receives sensor signals (not shown) from sensors 104A and 104B as an input to generating the control signals 511A and 511B. The first power load 120A and second power load 120B are coupled to their associated power switches 118A and 118B to selectively receive the provided power from the associated power switch 118A and 118B. As each of the components are separate components, each much be separately wired or connected together. The power control system 500A has two sets of discrete power control assemblies 501A and 501B for providing power to two power loads 120A and 120B and requires at least 28 wire terminations 124, each of which requires initial installation and ongoing maintenance.

In contrast, FIG. 5B illustrates a power control system 500B according to some embodiments of the invention that includes a controller 501 and two integrated power control assemblies 502A and 502B for providing power to power loads 120A and 120B, respectively. Each power control assembly 502 includes a unit integration coupling mechanism for mechanical and electrical coupling of the various components into an integrated power control assembly 502. Such a unit integration coupling mechanism can take many forms. For example, in one embodiment, a unit integration coupling mechanism can include one or more housings configured with interlocking features and couplers for mechanically engaging the various components and for establishing and maintaining necessary electrically connectivity, and, where desired, communications connections. In other embodiments, such coupling and connectivity is configured for pluggable or releasable coupling such as through snap couplers, compression contacts, etc. In other embodiments, the unit integration coupling mechanism for an integrated power control assembly 502 could be a plurality of housings configured for interlocking and interconnection for a common mounting such as a rail or more specifically, a DIN rail mounting system. In various embodiments, the integrated power control assembly would include an assembly that couples vertically and/or horizontally, but within a reduced footprint and with fewer external or required wiring connections, due at least in part, to the integration coupling mechanism with integrated and mated electrical connections.

As shown, the power control assemblies 502A and 502B have a single interface to a remote controller 501 via a control link or communication bus 507. Each of the power control assemblies has a control bus interface 505A and 505B for interfacing with the communication bus 507 and to the controller 501. Each of the power control assemblies 502A and 502B includes an integrated power switch controller 504A and 504B that are shown as including a proportional, integral, derivative PID control component, by way of example. The power switch control function can be PID control but can be in any method or system for controlling the operation of the power switch, including but not limited to adaptive PID control, proportional control, a proportional/integral control, a proportional, integral, two derivatives (the second being for acceleration) (PIDD) control, feed forward, feedback, by way of example. Each power switch controller 504A and 504B is coupled within the power control assembly 502 by an internal integrated interface 506A and 506B. The internal integrated controller to power switch interface 506 can provide for a mechanical and electrical coupling of the power switch controller 504 to the power switch 118 located within the power control assembly 502. Similarly, a fusible link 516A and 516B, such as a fuse or circuit breaker, by way of example, can be within the power control assembly 502 in which case a fusible link to power switch interface 508A and 508B can provide for the mechanical and/or electrical coupling of the fusible link 516 to the associated power switch 118. Additionally, the power control assembly 502B can also include an integrated sensor 104B via an integrated internal interface 512. In other embodiments, an external sensor 104A can be coupled to the integrated power switch controller 504A via a sensor interface 510.

Generally, the integrated power control assembly 502 can have one or more components such as the power switch controller 504, the fusible link 516, the power switch 118, sensor 104, and associated internal interfaces 506, 508, and 512, all of which are integrated into a power control assembly 502 that provides for a reduced footprint and fewer wired connections. While not shown in FIG. 5B, one or more integrated power control assemblies can also include other integrated components such as a second power switch (for example a contactor or mechanical relay), a power measurement component, a limit component, a current sensing component, etc. These can also be included in a similar manner as the illustrated power switch controller 504, the power switch 118 (shown as a solid state relay (SSR)), and fusible link 516 into and within a combined or single operating unit for controlling and providing powering to one or more power loads 120.

Additionally, one or more power control assemblies 502, such as shown as 502A and 502B, can include an internal integrated proportional, integral, and derivative (PID) control function for internal operational control and for communication to a controller 501 or with each other over the common communication bus 507. The controller 501 can communicate with both power control assemblies 502A and 502B or one or more components thereof, without requiring separate or dedicated connections or wire terminations between the components of each power control assembly 502. As such, the power control system 500B requires 13 wiring terminations 124 for each control assembly, which is a beneficial reduction from the 28 for each discrete control arrangement required in power control system 500A of FIG. 5A.

As will be discussed, the controller 501 and/or the control component 504 can include a user interface (UI) module, an input/output module, and a communication module (not shown in FIG. 5B). Additionally, one or more modules within a power control assembly 502 or an integrated power control system 500 can include a processor or processing module (not shown) for one or more operations thereof. One or more of these processing modules can include a processor, memory, firmware, hardware, and/or software. The processing modules can also include an algorithm, a neural network, empirical data, numerical data, fuzzy logic, a neural fuzzy circuit, a residual life algorithm, an artificial intelligence module, a modeling module, and a statistical function.

Each memory can be any type of memory for storing data and/or software including EPROM, EEPROM, a virtual storage location on a network, a memory device, a computer readable medium, a computer disk, and a storage device operable to communicate information.

As one or more components is configured with a processing module that includes memory, these components provide for new and improved functionality within each component and among components of the power control system and with other operational or control systems, as will be discussed further herein and as will become enabled to those skilled in the art after comprehending the invention as described herein. For example, each component memory can store component configurations, system profiles or configurations, diagnostic data, diagnostic operations, and other operational data. Additionally, operating characteristics, events, status, failures, modes, and states, by way of example, can be stored related to one or more operations of the component, a module, or another component within the power control system. As just one example, a plurality of stored configurations enables the component to reconfigure to adapt to newly or changed components within the power control system. In one embodiment, a component can initiate or activate a feature not previously supported by another component or within the assembly, but which is now available due to a change within the power operating system. Such a change can include a software update or a change out or addition of a component.

Figure 6:
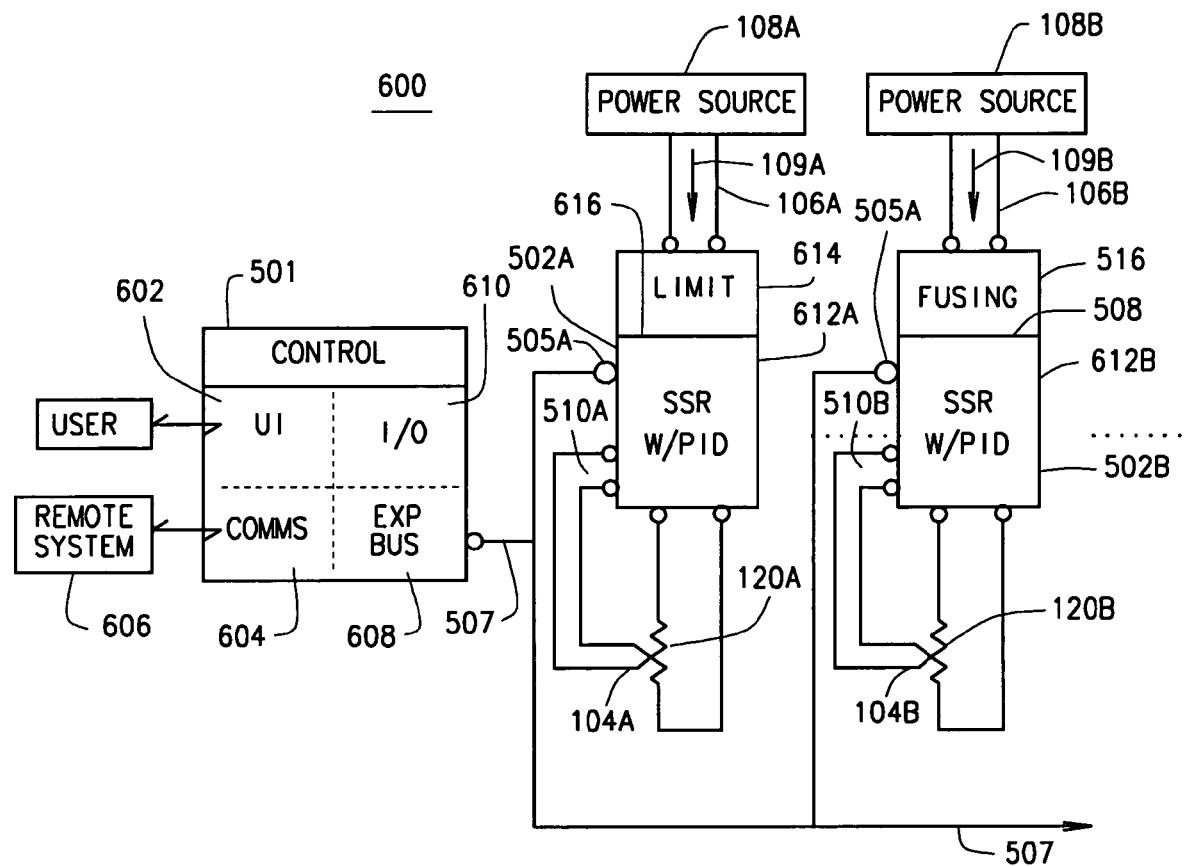
FIG. 6 is a block circuit diagram of a power control system having a single control module controlling a plurality of power control assemblies according to one exemplary embodiment of the invention.

Referring now to FIG. 6, a power control system 600 includes many of the same components and power control assembly features and functions, which are not repeated here. However, the power control system 600 further illustrates embodiments of the invention wherein the controller 501 that is connected to the communications bus 507 and thereby coupled to power control assemblies 502A and 502B, can include a user interface 602 for receiving or providing information and input to and output from a user. This can be any type of user interface, including, but not limited to, a keyboard, a mouse, a control panel, one or more buttons, a touch screen, and a voice input. A communication module 604 provides for interconnectivity and interoperability via a remote network or operational system 606 for control reporting, input, and interoperability for coordinated control of one or more processes or operations. An input/output module 610 can also provide for direct connected inputs or outputs that may be desired or required for a particular user application. These may include an interface for controlling a power switch that is not compatible with or coupled to the communication bus 507, or one or more sensors as described herein.

An expansion bus module 608 provides for interconnectivity with the communication bus 507 for coupling and communication with one or more integrated power control assemblies 502 and possibly other components, such as sensors, by way of example, that can be coupled to the communication bus 507. The communication protocol of the expansion bus component 608 can be adapted to be compatible with any type of communication bus 507 within the power control system 600, or modules within the power control assembly 502 therein. As noted above, the communication bus 507 or link can also provide for communication between two or more power control assemblies 502, or between the power control assembly 502A and power control assembly 502B, or components and modules thereof. The communication link and interface can be any communication system including a hardwired, optical or wireless facility. The communication link and component communication interfaces can be compatible with a WatBus™, Dallas Semiconductor one-wire protocol, Seriplex, sensorbus, DeviceNet™ bus, FMS, Lon Works, Control Area Network (CAN), Interbus S, SDLC, AS-Interface (AS-i), Local Interconnect bus (LIN-bus), EEE-1118 bus, Profibus, Modbus RTU, an enterprise communication bus including an Ethernet TCP/IP, the Internet, a token ring LAN, an Ethernet LAN, an FDDI network, a private data network, an ISDN, and a VPN, by way of example.

The communication bus 507 can be a two-way communication facility that provides for increased integration and centralized control and configuration of the components within the power control system. The communication can include status, commands, alarms, indicators, messages, software, system profiles, configurations, parameters, and characteristics associated with the operation, control, sensing, or diagnostics functions of the one or more components or modules of the power control system. By way of example and as will be discussed below, the communication bus 507 provides for communication of software downloads, storage, changes and recalling of a stored profile or component configuration. In some embodiments, the communication bus 507 interfaces with processing systems contained in one or more components of a power control assembly 502 for operational integration and combination of power control loop characteristics, parameters, data and variables, and can enable improved administration and operational data from the power loop to the controller and to remote administration and management systems. Additionally, the power control assembly 502 with its integration coupling mechanisms and integrated communication bus 507 provides for application specific control schemes, methods, profiles, configurations, and operations so that the power control system 600 can be customized and adapted to one or more user applications.

As will be discussed below, an integrated power control assembly 502 is a common integrated configuration or assembly containing a plurality of power control system components. In many embodiments, one or more power control components are not integrated within the power control assembly 502 that is in or near the user application, but is remotely located for easy access by a user. However, in many embodiments, the majority of power control system components are contained within or associated with the power control system 600 or one of the power control assemblies 502.

As noted above, the power control assembly 502 can include any component associated with providing power to a power load in a variety of user applications. As one example of a power control assembly 502 or system 600 for providing power to a heater application, the power control assemblies 502 can include a plurality of components in a thermal control loop. These can include components for a process sensor, a temperature/over temperature controller, current sensor or transformer, switch/relay/contactor, a fuse, a limiter, a limit sensor, and a power load. As illustrated by way of example in FIG. 6, the power control assembly 502A includes a power switch 612 (similar to 118 above) that may be a solid state relay, silicon controlled rectifier, a mechanical relay, or contactor (by way of example, and a limit component 614 in a tower-like integrated power control assembly 502A and/or 502B. The power control assembly 502A in FIG. 6 includes an interface 505A for interfacing to the communication bus 507 and a power receiving interface 106A to the limit component 614 for interfacing with the power supply 108A. In the alternative or in addition, as with the power control assembly 502B, a fusible link 516 can be included. The fuse link 516 can be a fast blow fuse or a circuit breaker, by way of example, for protecting the power control switch 612B. The power control assembly 502A also includes the power switch 612A that is shown to include an integrated PID control function. In the alternative, a separate control component 504 and power switch 612 can be included or can be combined via an integration coupling mechanism such as a housing. In the power switch control assembly 502A, a power switch control function is shown as a PID control for controlling the power switch 612A and thereby providing power to the power load 120A (shown as a resistive heater). The power switch 612A can further include, as in this example, a process sensor interface 510A for interfacing with the sensor 104A (shown as a temperature sensor). Similar features, interfaces and coupling also apply to the second power control assembly 502B. Additional power control assemblies 502 can also be coupled to the communication bus 507 and coordinated by the controller 501.

Figure 7:
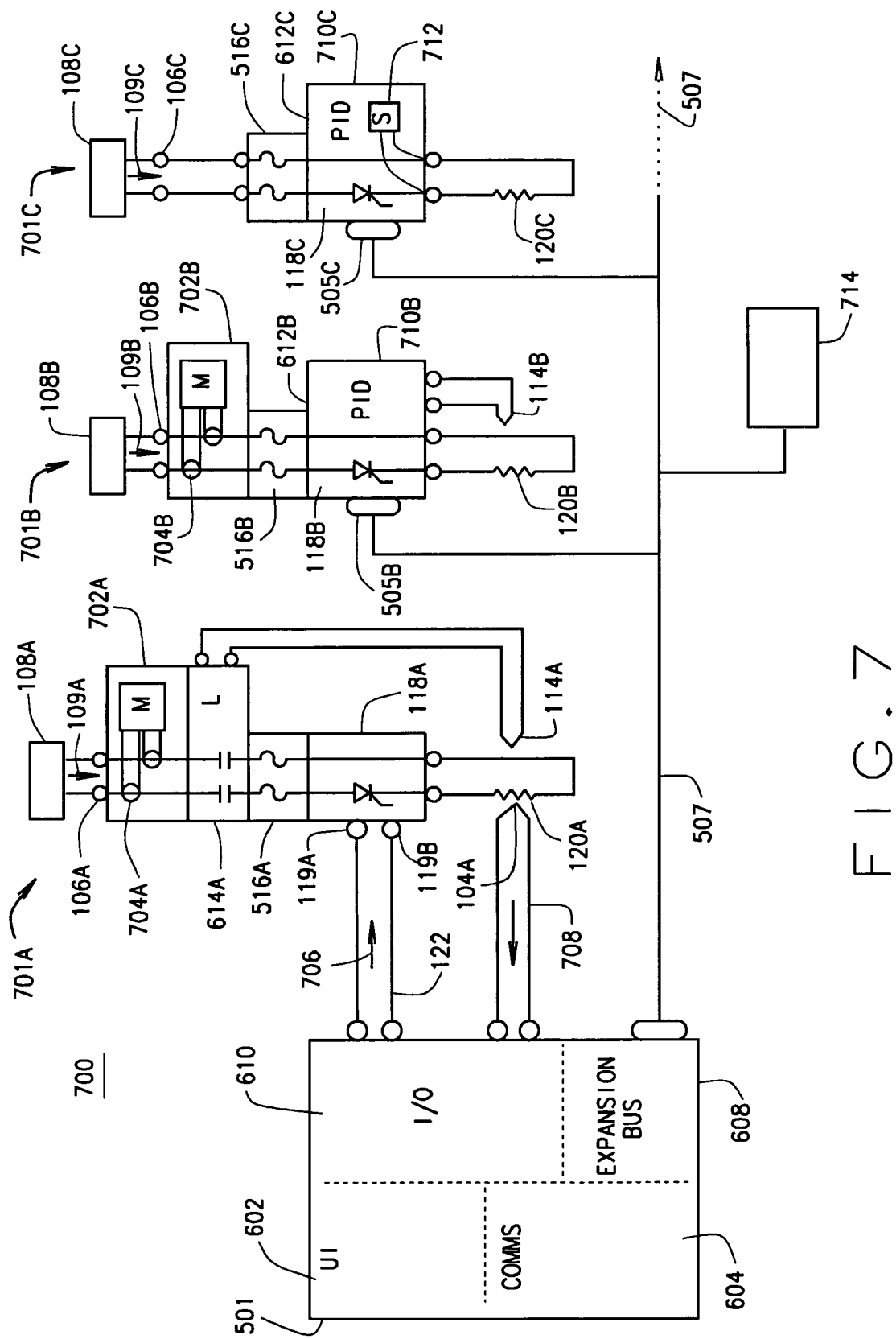
FIG. 7 is a block diagram of power control system according to another exemplary embodiment of the invention.

As illustrated in FIG. 7, in some embodiments a controller 501 can be communicatively coupled to one or more integrated power control assemblies 701A, 701B, and 701C via the communication bus 507. As shown, integrated power control assembly 701A does not include an integrated power switch control component but includes a power switch 118A with two power switch control terminals 119A and 119B. The input/output module 610 of the controller 501 provides a power switch control signal 706 for controlling the power switch 118A. The input/output module 610 also includes an interface for receiving a sensor signal 708 from the sensor 104A associated with the heater or power load 120A. The power control assembly 701A also includes a power measurement component 702A for measuring the power provided to/from the power control assembly 502A. The power measurement component 702A can include one or more sensors or transducers 704A associated with an internal power bus of the power control assembly 701A and can measure various electrical characteristics for determining a measurement of power as are known to those skilled in the art. A limit switch or limit component combination 614A is also included and is responsive to the limit sensor 114A for providing an operational limit as is known in power control systems.

In the power control assembly 701B and 701C of FIG. 7, an integrated power switch control component or module 710B and 710C are coupled to power switches 118B and 118C, respectively, for controlling the associated power switch. The power control assembly 701B includes a power measurement component 702B with one or more power measurement transducers 704B. Additionally, the power control component 710B includes the interface 510 for receiving input from the sensor 104B for controlling power switch 118B. The power control assembly 701C differs in that it includes a fusible link 516C but does not include a power measurement component 702 or a limit component 614. However, power control component 710C is configured to include an integrated temperature measurement component 712 that can be configured for determining the temperature of the power load 120C by measuring one or more electrical characteristics of the power on the output of the power switch 118C.

As illustrated in the power control system 700 having three exemplary power switch assemblies 701A, 701B, and 701C, each can include a variety of components, but includes, at least in some manner, an integrated assembly that provides for interconnectivity and interoperability with minimal user interaction such as hard-wiring connections 124 (as shown as a small circle with a line). Each of the components of each power control assemblies 701 is operationally and physically coupled by a power control assembly mechanical and electrical coupling mechanism with interfaces as will be discussed in more detail below. Also, the communication bus 507 is configured for communication between each power control assembly 701 and the power controller 501, other power control assemblies 701 and other coupled components 714 that are coupled to the communication bus 507.

Figure 8:
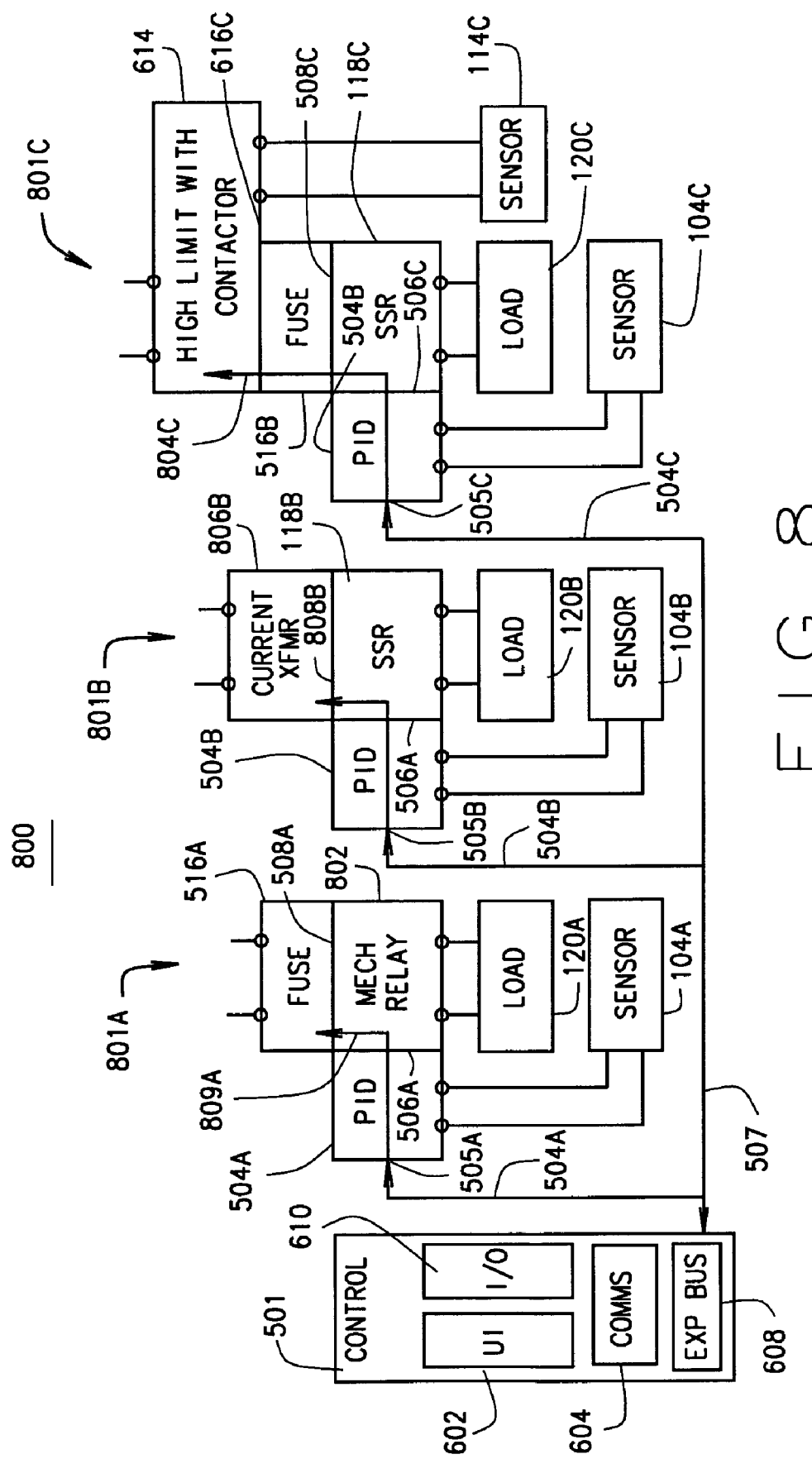
FIG. 8 is a block wiring diagram of another power control system according to another exemplary embodiment of the invention.

FIG. 8 illustrates another embodiment of a power control system 800 having a controller 501 connected to three power control assemblies 801A, 801B, and 801C, shown as functional blocks. The power control system 800 is similar to many of the same and similarly marked system components as shown in power control system 500B of FIG. 5B, power control system 600 of FIG. 6, and power control system 700 of FIG. 7, and therefore a description of each of these components will not be repeated here. However, the power control system 800 illustrates additional embodiments that include a mechanical relay 802 as the power switch in power control assembly 801A, and a current transformer 806B as a power saving component of the power control assembly 801B. The current transformer 806B can provide for monitoring the power received from the power source.

Additionally, an internal control bus 804 (shown as 804A, 804B, and 804C) is provided in each of the power control assemblies 801A, 801B, and 801C. In these arrangements, the communication bus 507 interfaces with the control modules 504A, 504B, and 504C via the communications interface 505A, 505B, and 505C, respectively, for providing and receiving communications such as control data and information. However, as illustrated each of the power control assemblies 801A, 801B, and 801C is configured with an internal communication bus 804 for communicating within and between the various components of the power control assembly 801. The internal communication bus 804 can be integral to the integration coupling mechanism, such as through connectors and connections within a housing or via contacts that electrically couple together upon the assembly of the power control assembly 801. For example, the internal communication bus 804 connectivity can be automatically connected upon the releasable coupling of a housing containing the mechanical relay 802 and the power switch control component 504A of power control assembly 801A. In this manner, the integrated operational features and functionality as provided between the controller 501 and with and/or between each of the power control assemblies, can be further integrated as an internal communication and control facility between components within a single or between one or more power control assemblies 801. In such embodiments of a power control system and power control assemblies, any communication received by the power switch control module 504 can be relayed or communicated internally within the power control assembly 801.

From this, it can be seen that additional power control components within each power control assembly 801 can be easily added and removed and still ensure connectivity and interoperability. Based on a desired user application, one or more power switch control components 502, power switches 118, sensors 104 and 114, power loads 120, alarms (not shown), events (not shown) and auxiliary functions (not shown) can be added as needed without requiring substantial rewiring or manual manipulation of the individual components within the integrated power control assembly 801.

Figure 9:
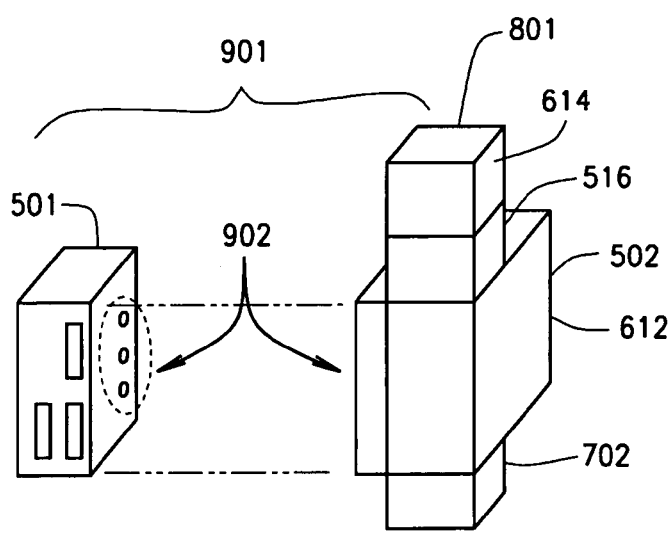
FIG. 9 is an exploded view of a thermal power control system showing the integration of a control component within a power control system according to another exemplary embodiment of the invention.

Referring now to FIG. 9, in some embodiments the controller 501 can also be integrated or at least mated to the power control assembly 801 by integrated mating contacts 902. The mating contacts 902 can be such that when the controller 501 is mounted adjacent to the power control assembly 801, a mating and coupling is accomplished without requiring manual user connection activity. In the illustrated example of FIG. 9, a DIN rail mounted temperature controller 501 operably mates with the power control assembly 801 via mating contacts 902 to form an integrated power control system 901. In some embodiments, the mating contacts 902 may be one or more pluggable connectors.

Figure 10:
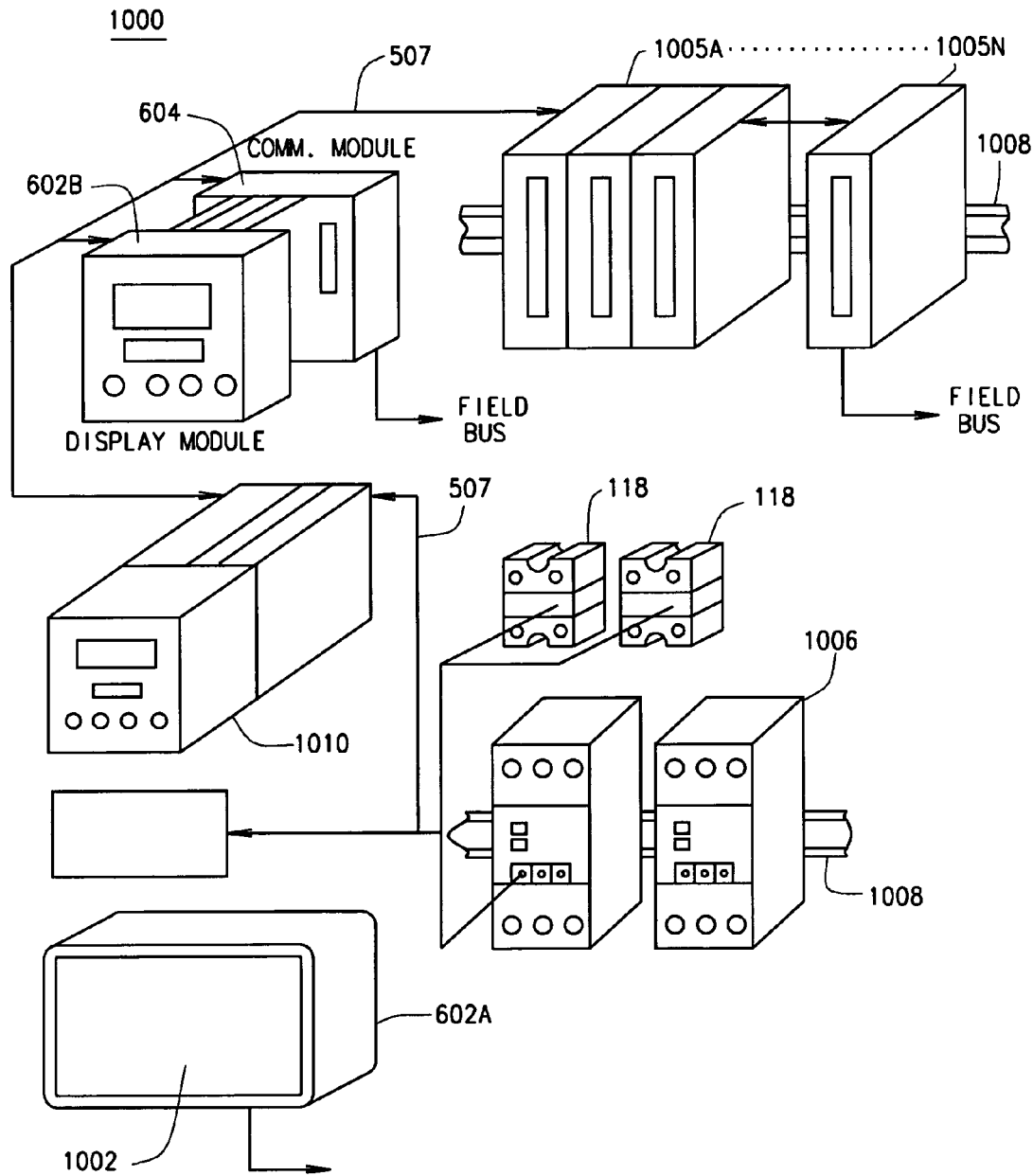
FIG. 10 is a block diagram of a power control system showing the integrated communication system in the components of the power control system according to another embodiment of the invention.

FIG. 10 is a block diagram of a power control system 1000 having an integrated communication system according to some embodiments of the invention. The power control system 1000 includes one or more communications buses 507 that provide for communication connectivity between various similar and dissimilar components and power control assemblies 502 comprising a system for controlling power in a power control operation such as a processing operation, by way of example. This exemplary embodiment is not intended to illustrate a particular layout or arrangement for the components or modules of the power control system. As illustrated in FIG. 10, a communication link or bus 507 may be any form of communication facility and in one example, is a WatBus™. A user interface (UI) 602 can be included and can communicate via the communication bus 507 or can communicate via a fieldbus communication facility (not shown). The user interface 602A is shown, by way of this example, as a touch screen 1002, but can be any form of interface receiving a user command or input. Other examples include a keyboard, a mouse, a touchpad, a voice input, and a data input and is illustrated by way of example as user interface 602B. One or more power switches 118 or switching components can also be connected to the communication bus 507 as is shown as solid state relays (such as ones known as a hockey puck SSR 118), DIN rail mounted power control assemblies 1005, and DIN-A-MITE™ contactor 1006 or contactor configured for coupling to a DIN rail 1008. A control component such as a DIN controller 1010 can also be connected via the communication bus 507. A display module can provide a user with displayed information regarding the power control system. One or more power switch components (illustrated as DIN rail mounted controls) and a communication module 604 can also be connected to the communication bus. Also as shown, the DIN rail mounted power control assemblies 1005A-N can be fully integrated control assemblies such as integrated power control assemblies 701, 801 and 901 with integrated components and modules.

Figure 11:
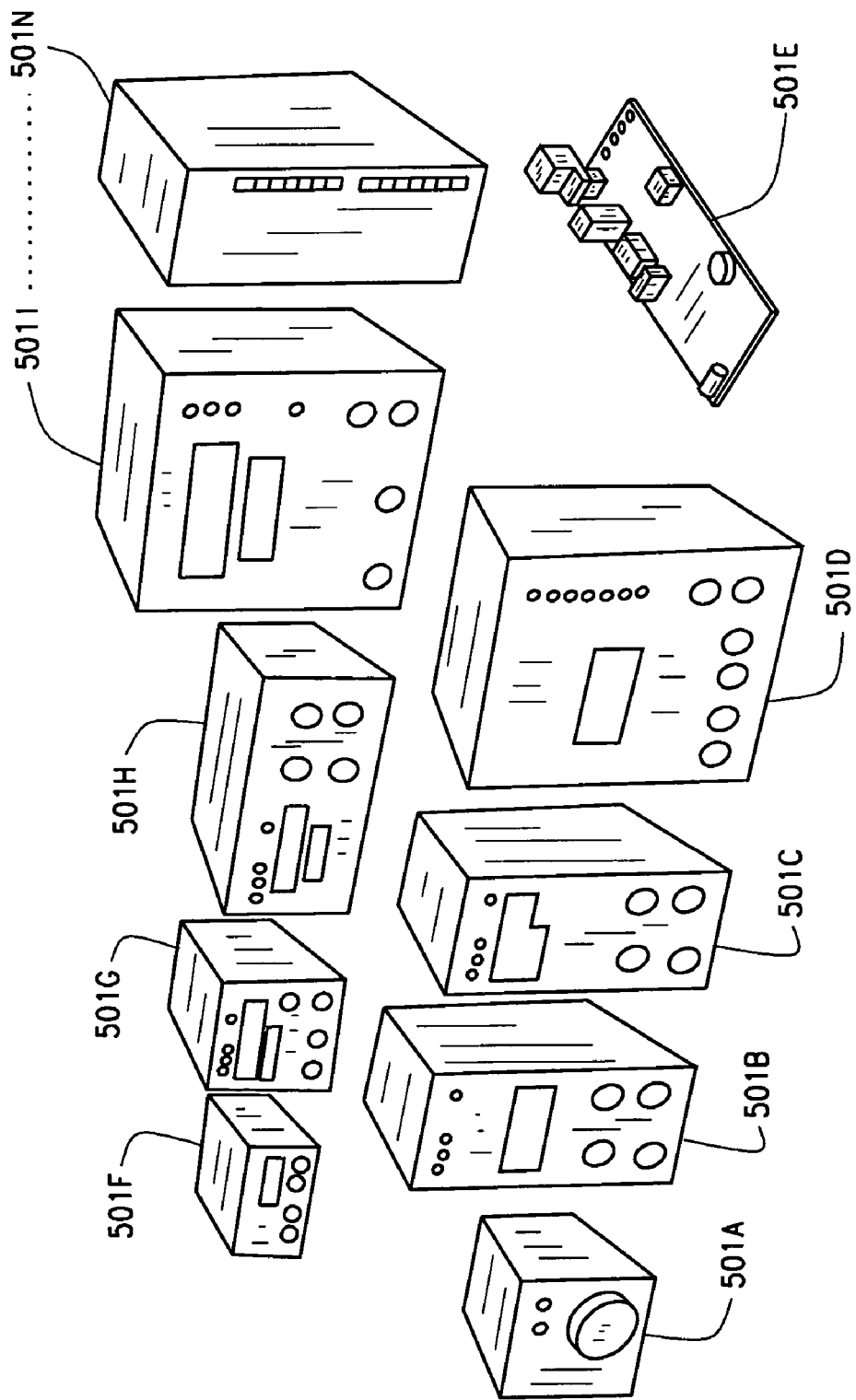
FIG. 11 is a graphic image of a plurality of scalable user interfaces for scalable control of the power control system according to various exemplary embodiments of the invention.

Each component within the power control system is configured or adapted for plug-and-play within the power control system. Additionally, modules within a component can also be configured for plug-and-play. FIG. 11 illustrates one exemplary set of interchangeable control modules 501A-N wherein each contains a user interface having different functionality or none at all as in the case of a factory programmed unit. Each of the plurality of control components within the power control system family of components can contain different modules or functionality. Each of the user interfaces of 501A-N can be adaptable for optional inclusion into embodiments of the system. As noted, the user interface can simply be status lights or LEDS, can be a seven segment display with a rotary knob for user selection and input, can include input keys, or can include a LCD display. The particular selection of each is at the user discretion based on the application needs as each of these embodiments is compatible with each of the other modules and components within the power control system. As illustrated, each can be of a different size and require a different number of connectors; however, they are still compatible within the power control system in a plug-and-play manner.

However, each and every one of the control components is compatible with each and every other component and each and every other member of a component family within the power control system. As such, as illustrated in FIG. 11, embodiments of the invention provide for scalable configuration of the control module 501 so as to adapt to the user environment. Additionally, each can be replaced by another, thereby providing for each modification and adaptation by the user.

Another aspect of various exemplary embodiments of the invention is scalability. For example, the communication module 604 can include a plurality of communication interfaces and a plurality of communication buses 507 or loop configurations. As such, the control component 501 is scalable to meet the requirement of the particular user application without requiring a separate or different control component. The control modules such as a particular communication interface card can be adapted to the particular design or application without requiring a replacement or substitution of the control component or module 501.

FIGS. 12A-E illustrate various arrangements of a power control system according to various embodiments of the invention. In one exemplary embodiment, a power control system 1202 is a predetermined or minimum configuration (MC). Such minimal configuration 1202 can also be used in conjunction with a simple user interface 602 as in 1204, a power switch controller 504, and can include an alarm indicator such as a light or a flag (not shown). As in FIG. 12C, the system 1206 has two or more minimal configurations 1202 that are implemented with a common user interface. In FIG. 12D, a minimal configuration 1202 is combined with a user interface 602 and a communication module 604 to form a system 1208. In FIG. 12E, a plurality of minimal configurations 1202 are combined with a single user interface 602 and a single communication module 604.

As discussed above, various embodiments of the invention include a power control assembly integration mechanism such as a housing for coupling the system components as an integrated assembly. As also mentioned, in some embodiments the components or modules of the power system or a power control assembly are configured to mechanically connect with snap-in or pluggable connectors, or housings that are adapted to mechanically and electrically couple the components into a single integrated assembly. In some embodiments, each component within a power control assembly can comprise a separate layer, or a portion of a layer, such that the portion is configurable with another portion and the combination of the one or more portions substantially comprise one of the pluralities of layers. Of course, layers can be vertical or horizontal in practice, and may be combined in a single embodiment. System and methods for operationally combining these components into an integrated power control assembly will now be described and illustrated.

Figure 13A:
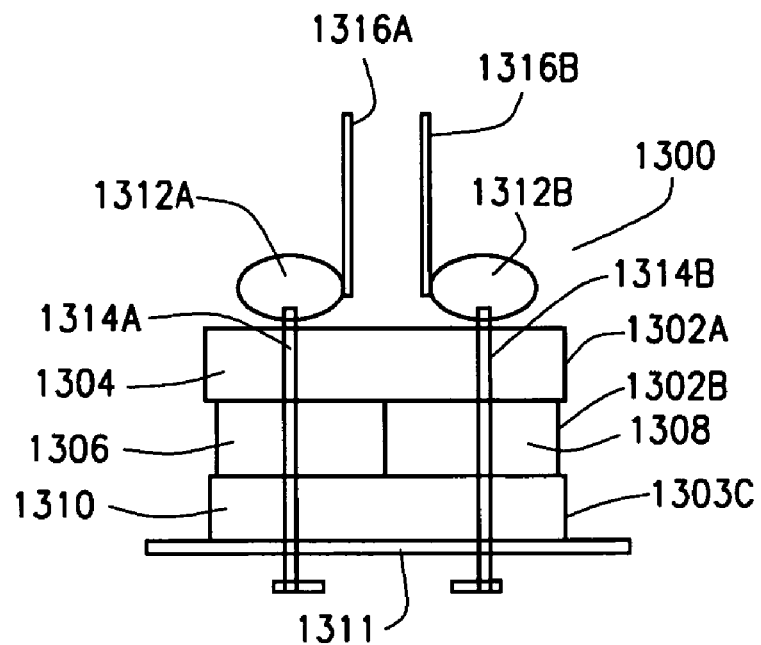
FIGS. 13A and 13B are block diagrams illustrating a compression coupling mechanism for a power control system according to one exemplary embodiment of the invention.
Figure 13B:
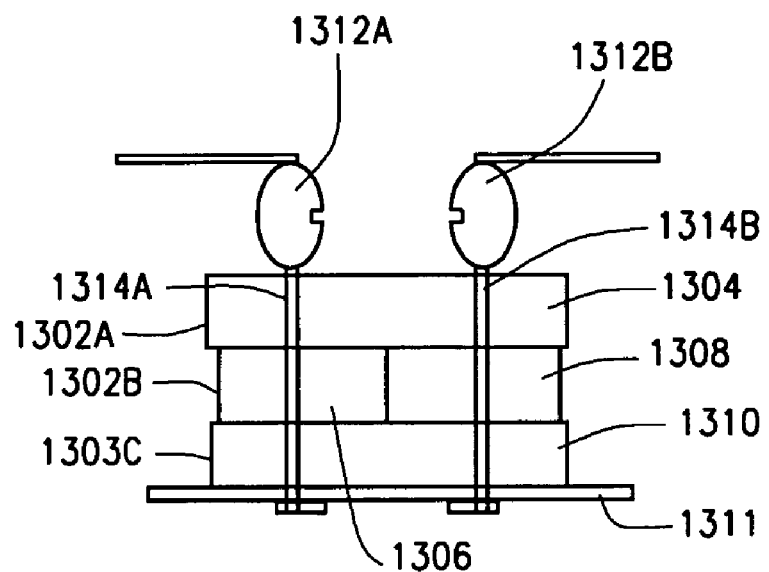

In some embodiments, a unit integration coupling mechanism provides for mechanical, electrical, and communication coupling of each component within the power control assembly. The unit integration coupling mechanism can provide a mechanical connectivity between two or more components that couples two units together in a fixed or in a biased arrangement. In one embodiment, a biased coupling can be provided by a cam locking system or means, one exemplary embodiment of which is illustrated in FIGS. 13A and 13B. As shown in FIG. 13A, a four component power control assembly 1300 has three layers 1302A, 1302B, and 1302C, with the first layer 1302A having a component 1304, the second layer 1302B having two components 1306 and 1308, and the third layer 1302C having a single component 1310. As shown, two locking mechanisms 1314A and 1314B are positioned to couple all three layers top and bottom of the power control assembly layered-stack and through a bottom or unit mounting plate 1311. Two cam devices 1312A and 1312B are attached to the two locking mechanisms 1314A and 1314B at the top. In such an arrangement, the four components can be removed from the power control assembly 1300 when the can devices 1312A and 1312B are unlocked.

FIG. 13B illustrates each of the cams 1312A and 1312B in a locked position about the locking mechanisms 1314A and 1314B. In this arrangement, the two locking cams 1312A and 1312B at the top have been rotated to a locked position. When the two locking mechanisms 1314A and 1314B are in a locked position, the four components 1304, 1306, 1308 and 1310 are mechanically and operationally coupled as a single power control assembly 1300. In this exemplary embodiment, the locking mechanisms 1314A and 1314B and/or the cam devices 1312A and 1312B can be comprised of a solid constructed material or can be comprised of an elastic material. When an elastic material is used, the locking mechanisms 1314 provides a bias or compression force such that the four components 1304, 1306, 1308 and 1310 are compressed together. The compression force provides for continuous coupling without requiring user intervention or adjustment during operation and reduced operator maintenance.

Another type of power control assembly integration coupling mechanism includes a biased or compression coupling (not shown). For example, a threaded device having a shoulder to limit insertion of the threaded device and a spring. In operation, one or more threaded devices can be utilized as a unit integration coupling mechanism to provide the continuous bias or compression force to the components of the power control assembly. Each threaded device is configured such that the device is inserted to the shoulder and cannot be inserted further, thereby limiting over-tightening by a user during installation. The device can be configured such that when the device is inserted to the shoulder, the spring is at least partially compressed. In one embodiment, the spring is only partially compressed. As such, the spring applies the compression force to operably couple the components within the power control assembly. The continuous compression force eliminates terminal or connection heating often caused by connection resistance or loose connections.

As noted, the unit integration coupling mechanism while described as a mechanical coupling, also provides electrical coupling between two or more components of a power control assembly. The electrical coupling can result from the mechanical coupling and bias applied by the unit integration coupling mechanism. The electrical coupling of the supply power, load power, communication links, and unit operational power is provided by inter-component couplers configured into each unit component such that when the coupling is actuated, the necessary electrical connections are completed. Additionally, in the embodiment utilizing a compression or bias unit integration coupling mechanism, the connections are biased to ensure continuous connectivity of the connections. In other embodiments, the electrical connections are made separately but enabled by the mechanical coupling. For example, in one embodiment, an electrical termination assembly or mechanism between components within a power control assembly can include a compression contact of a surface that can be made with a clip receptacle having a spring-type acting on a blade portion of an adapted connector. Such an arrangement can also provide for mechanical self-alignment of the various components during installation.

As noted above, in particular embodiments, two or more housings can be adapted for providing the mechanical coupling of the power control assembly integration coupling. Additionally, the housings can be configured to include electrical connections that are mated or connected upon the mechanical coupling of the two or more housings.

Figure 14A:
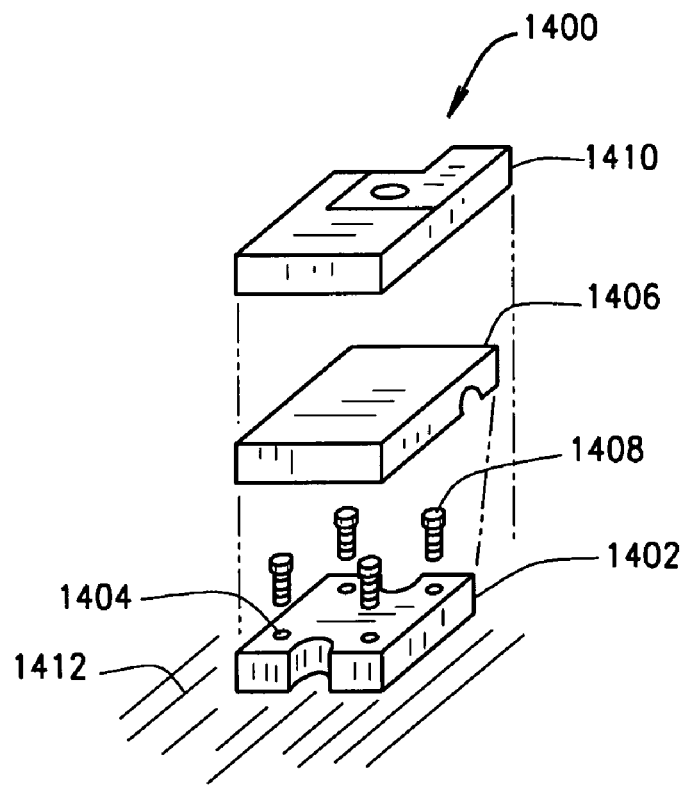
FIGS. 14A and 14B are side perspectives of a integration and coupling system for compression coupling to a solid state relay having a hockey puck configuration according to another exemplary embodiment of the invention.
Figure 14B:
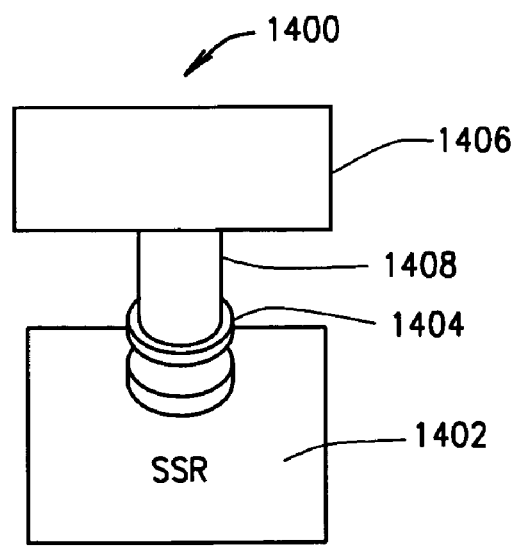

One example of such a biased inter-component connection is illustrated in FIGS. 14A and 14B. In this exemplary embodiment, a power control assembly 1400 is configured to include a solid state relay (SSR) 1402, such as a well known one having a hockey puck configuration. A well-known hockey puck configuration SSR is illustrated in FIG. 14A having dimensions including a 2.3" square. The hockey puck SSR 1402 has four screw seats 1404 for receiving a screw and wire clamping device (not shown). Two of the screw seats 1404 are for control leads for receiving a control signal for operating the SSR 1404 as a switch and two are for receiving and providing supply power. Four ball posts 1408 are positioned to couple to the four screw-seats 1404 of the SSR 1402. The posts 1408 can couple to a limit component 1406 providing a limit switching function to the SSR 1408. A PID controller 1410 component is coupled to the limit component 1406 thereby providing control functions to the operation of the SSR 1402. As shown, the PID controller 1410 and limit component 1406 within the illustrated SSR power control assembly 1400 are proportionally dimensioned and configured for a stackable engagement and coupling to the hockey puck SSR 1402 without changes to the SSR configuration or design. Additionally, the SSR 1402 and the other components of the power control assembly 1400 do not require connections or wiring other than that provided by coupling of the three components together with a compression force provided by the inter-coupling arrangements.

To accomplish this, the screw and wire clamp are removed (as illustrated in FIG. 14) and a ball-ended post 1408 of the limit component 1406 is biased to engage the screw seat 1404. As illustrated, the limit component 1406 and/or switch control component 1410 of the power control assembly 1400 is equipped with the ball post 1408 that, when biased as a part of the unit integration coupling mechanism, is compressed into the screw seat 1404 of the SSR 1402, thereby completing an electrical power or electrical control connection with the SSR 1402. The power control assembly 1400 provides the compression force such as to apply a compressed electrical coupling to the SSR 1402 consistent with standard SSR pressure placement and arrangements and specifications. These can be to just the control inputs to the SSR 1402 or can be to the electrical power input and output leads of the SSR 1402.

FIG. 14 illustrates the power control assembly 1400 wherein the limit component 1408 is operably coupled to and positioned between the SSR 1402 and the switch control 1410. In this exemplary embodiment, the limit component 1406 includes a supply power connector for receiving the supply power from a power source. The switch control 1410 includes a PID algorithm, by way of example, for controlling the SSR 1402 as a power switch. The switch control 1410 is operably coupled to the two control leads of the SSR 1402, the connection being made in this embodiment through the limit component 1406. In another embodiment, the configuration of switch control 1410 and the limit controller 1406 can provide for the limit component 1406 to connect directly to the two supply power screw-seats 1404 of the SSR 1402 and the switch control 1410 can connect directly to the two control screw-seats 1404 of the SSR 1402.

Typically, a power switch such as the SSR 1402 is thermally coupled to a heat sink 1412. A switch control 1410 with PID algorithm is positioned and coupled to the SSR 1402 such that the two controller screw-seats 1404 are electrically coupled to the switch control 1410 for controlling the SSR 1402 switch. One or more printed circuit or wiring board (PCB) couples to the supply power screw-seats 1404 of the SSR 1402 and to pluggable cage clamp connectors for providing supply power to a power load (not shown). A combined limit and definite purpose contactor (DPC) component (not shown) can receive supply power from a power source and provides power to the input supply power connection of the SSR. The switch control component can be arranged to allow for the coupling of both the switch control 1410 and the limit-DPC component directly to the SSR 1402 in an interlocking arrangement. A communication module with a WatBus™ configuration, by way of example, can be arranged to be pluggable to one or both of the switch control 1410 and limit-DPC components. The communication module can be pluggable to one or both of the switch control 1410 and limit-DPC components and includes an interface to the communication bus 507. Additionally, one or more sensor interfaces (not shown) can be included to one or more of the components with the illustrated power control assembly 1400.

These embodiments of a power control assembly 1400 provide for improved field installations where the SSR component is located on a panel and the user installs the control component and the limit component to form a power control assembly or system according to some embodiments of the invention. Such connection assemblies can also provide for a factory assembly where the SSR is attached to the control component and/or limit component prior to shipment.

In other embodiments, one or more electrical connections can also be made between modules of one or more components, or between components of the power control assembly. Supply, load, and component power connections can be made by pin and receptacle or biased connections, one example being as discussed above. Connections for inter-component or inter-module communications can also be made using a metallic or optical interconnection such as with a pin and receptacle arrangement, or a bias plate and contactor arrangement.

In some embodiments, connections to external components or devices from the power control assembly include connections that only require minimum user interaction and input and provide for continuous post-installation biasing. While the industry generally utilizes a simple screw and clamp arrangement for attaching power supply and power load leads, these often loosen over time causing increased heating, arcing, and failure. As such, these connections are often the focus of routine maintenance requiring the user to retighten the screw, such as a ¼ or ½ turn every maintenance period. Additionally, external connections to the power control assembly can also utilize self-biasing or compression connections such that various sizes or diameters of wiring can be connected and the connections are continuously biased to ensure secure connectivity over time. Similar as discussed above, these external connections can be cam-operated mechanical connection, can be biased or elastic mechanisms, or can include a spring-biased, threaded device such as a spring-biased plunger, by way of example. In such embodiment, a spring-biased or elastic material-biased force is applied to the connection over the life of connection, thereby providing a continuous compression force to the connected wire even in view of aging and movement of the wire.

Figure 15:
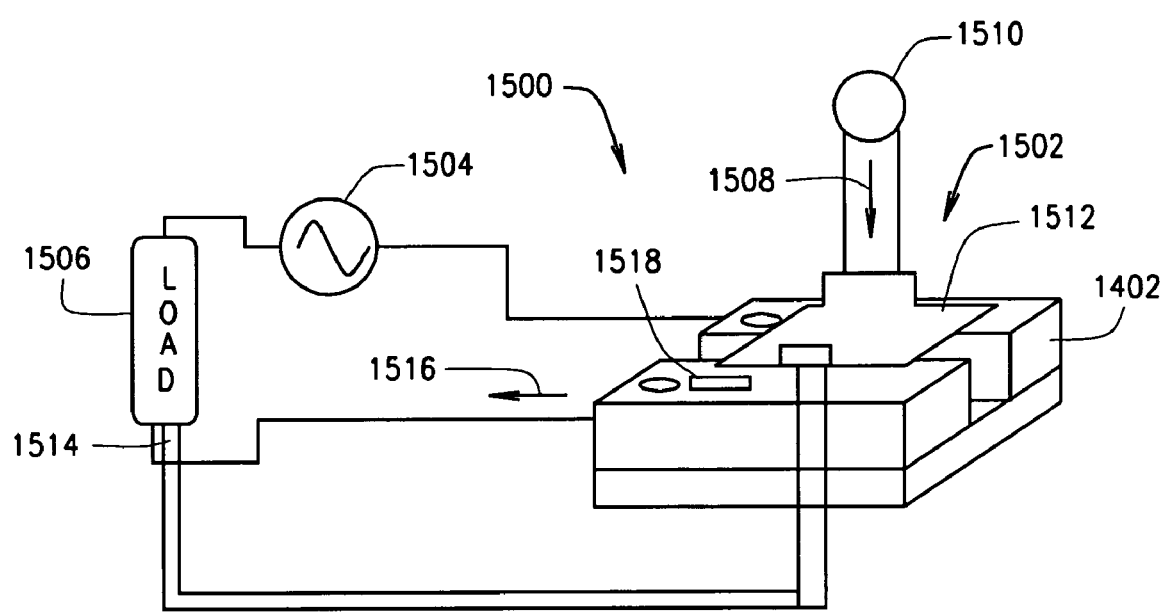
FIG. 15 is a block diagram of a hockey puck solid state relay contactor according to one exemplary embodiment of the invention.

FIG. 15 illustrates one exemplary embodiment of the power control assembly system 1502 in a user application 1500. As shown, a standard solid state relay (SSR) in an industry standard configuration is referred to as a "hockey puck." While the following describes a power control system as applied in some embodiments, it should be understood that this is just one exemplary embodiment and application of various aspects of the invention.

As shown in FIG. 15, the power control switch SSR 1402 is coupled in series with an AC power supply input 1504 and an AC power load 1506. The SSR 1402 receives a control input in the form of DC power 1508 from a logic controller or other DC power source 1510. A power switch control module 1512 is coupled to the SSR 1402. The power switch control module 1512 includes a connection for a control sensor 1514 that is positioned and configured for the AC power load 1506. Additionally, an electronic field sensor 1518 senses the electromagnetic field output generated by the SSR 1402.

Figure 16:
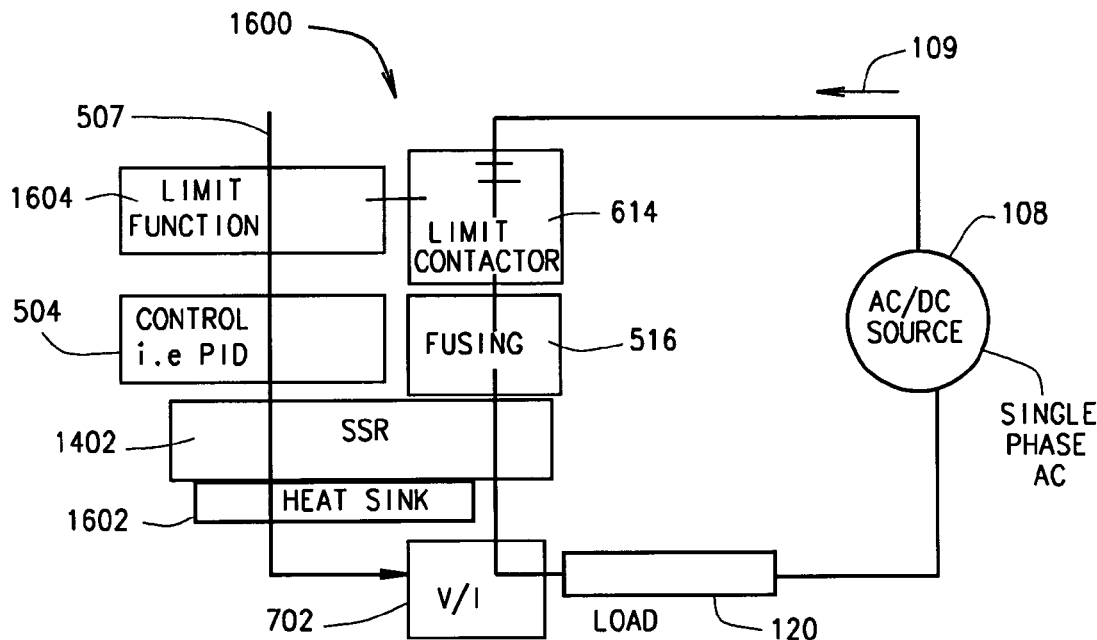
FIG. 16 is a block wiring diagram of a power control system with a power bus and a communication bus for providing single phase or dc power according to another exemplary embodiment of the invention.
Figure 17:
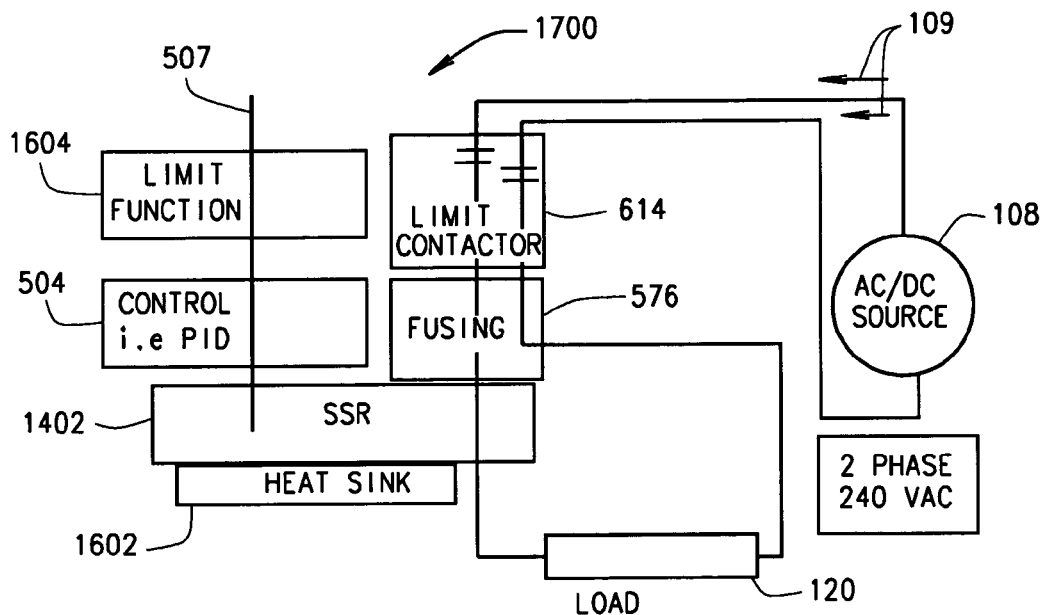
FIG. 17 is a block wiring diagram of a power control system with a power bus and a communication bus for providing two phase power according to another exemplary embodiment of the invention.

FIGS. 16 and 17 illustrate additional embodiments of an SSR power control assembly. FIG. 16 illustrates a single-phase AC power control assembly using a hockey puck configured SSR 1402 as one of the power switches. FIG. 27 illustrates a two-phase AC power control arrangement using the SSR 1402 for switching two-phase AC current. In FIG. 16, a power control assembly includes an SSR power switch 1402 component thermally coupled to a heat sink 1602 as is known in the industry. However, the SSR 1402 is mechanically and operably coupled to one or more other components of the power control assembly 1600. As shown, the communication bus 507, such as a WatBus™, provides for communications among the components and therefore for controlling the operations of the components within the power control assembly 1600. In this example, the communication bus 507 is connected to the limit component 1604, to a power switch control 504 (denoted as a PID by way of example only) and to the SSR 1402. Additionally, the communication bus 507 is also connected to the power measurement component 702 that monitors the power provided to the power load 120. A temperature sensor (not shown) can sense the temperature of the power load 120 and provide the temperature sensor signal (not shown) to the power switch control 504. The supply power 109 provides single phase AC power to the limit contactor 614. The limit contactor 614 receives a control signal (not shown) from the limit contactor controller 1604. The limit contactor 614 is connected to the fusible link 516 which can be a fast-blow semiconductor fusible link or a circuit breaker for protecting the SSR. When actuated by the power switch controller 504, the SSR 1402 provides at least a portion of the supply power 109 to the power load 120. As illustrated in FIGS. 16 and 17, each of the components of the power control assembly 1600 is integrated into a common integrated assembly such as a "tower" built upon the hockey puck SSR 1402. The various components of the power control assembly 1600 are coupled using an integration unit coupling mechanism as described above that provides for both mechanical and electrical coupling of each of the components.

Similarly, FIG. 17 illustrates a power control assembly 1700 for switching two-phase AC power provided by the two phase AC power source 108. The other components of the power control assembly 1700 are similar to those described above with regard to power control assembly 1600 and are not repeated here for sake of brevity.

In some embodiments of the invention, a control assembly for use in an integrated power control system has a base including a housing and defines a cavity within the housing for receiving a power switch. The control assembly includes a control module configured for generating control signals for controlling the power switch for selectively providing power to a power load. A control housing is configured for housing the control module and adapted to be releasably coupled to the base housing and is configured for electrically coupling to control couplers on the base housing for providing the generated control signals to the power switch within the housing cavity upon coupling the control housing to the base housing.

Figure 18:
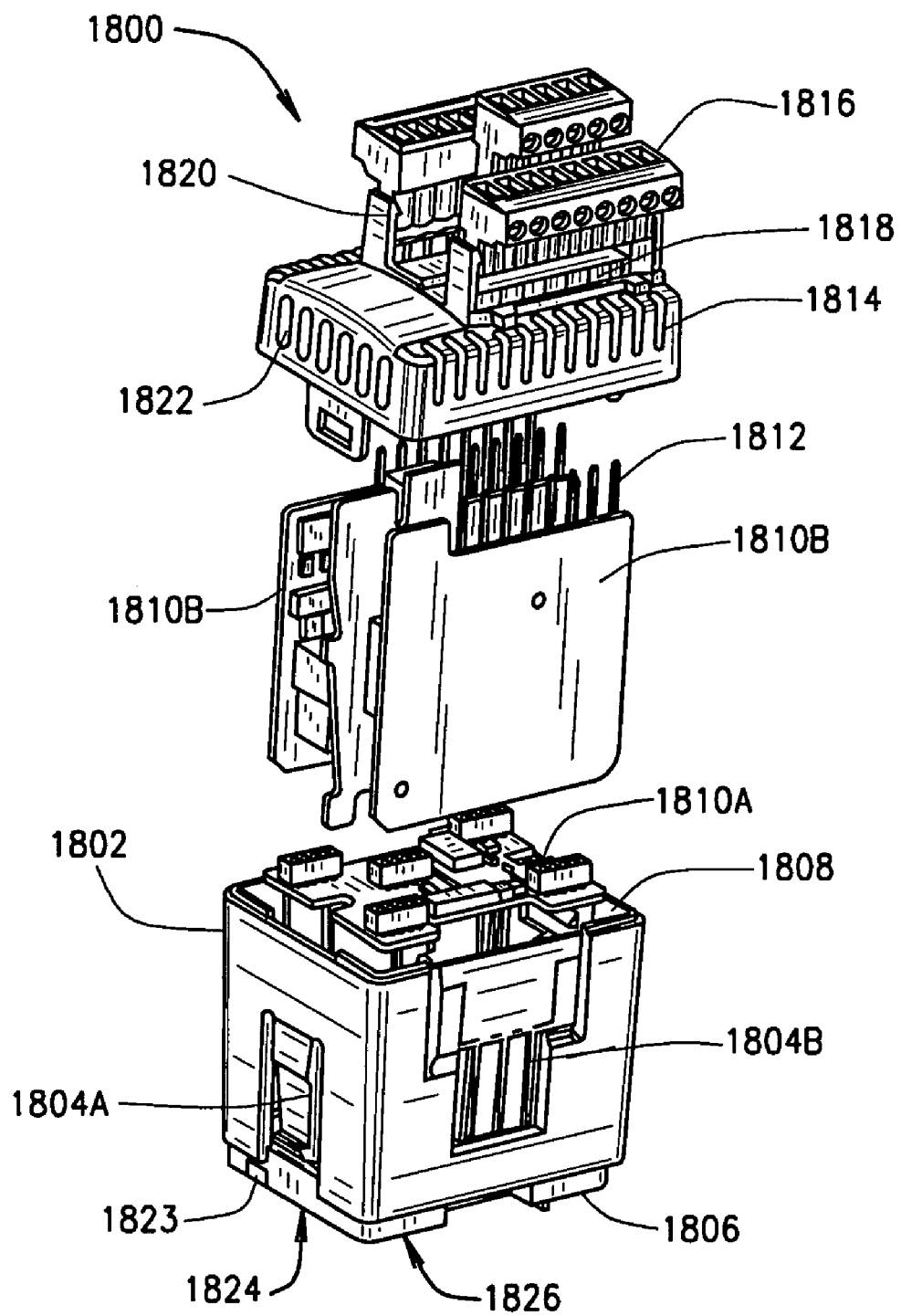
FIG. 18 is an exploded side perspective view of a power control module according to one exemplary embodiment of the invention.

Referring now to FIG. 18, a control module 1800 is illustrated in an exploded and unassembled view. The control module 1800 includes a control housing 1802 having one or more flexible mating members 1804 formed on the outer portion of the control housing 1802. A pair of flexible mating members 1804A are on opposing sides of the control housing 1802 and a pair of flexible mating members 1804B are on different opposing sides of the control housing 1802. As shown, the control housing 1802 defines a lower portion 1806 that may also be adapted by keying or other formations, to couple to or seat within a receiving or coupling portion of the base housing.

The control housing 1802, its lower portion 1806 and one or more sets of flexible mating members 1804A and 1804B are configured to be received and releasably coupled to a power control assembly base housing by interconnecting with the flexible mating members 1804. In the illustrated embodiment, two pairs of flexible mating members 1804 are illustrated. In such an embodiment, the control housing 1802 may be adapted to fit more than one base housing such as to enable the control housing 1802 to be mounted in more than one orientation, e.g., to either engage the flexible members 1804A or the mating members 1804B. In other embodiments, a single mating member 1804 may be adapted to couple to a base housing. Additionally, the lower portion 1806 can include one or more keying configuration or fixtures 1826 configured to engage a base housing adapted to selectively receive such keying fixtures 1826.

The control housing 1802 includes a cavity 1808 for enclosing one or more control modules 1810 that can be PCB boards containing one or more electrical components as described above, such as, by way of example, a PID switch control component, or a limit component. The control module 1810 can be retained within the cavity 1808 either horizontally 1810A or vertically 1810B. A cover 1814 can be configured for releasably coupling to the control housing 1802. As illustrated, the cover 1814 can include one or more electrical connectors 1816 for coupling the control modules 1810B to external wires, sensors, or a communication bus 507 (not shown). As shown, the cover 1814 can include one or more connector receiver cavities 1818 that provide for receiving at least a portion of the electrical connector 1816 and for enabling the electrical connector to connect to the PCB board connectors or pins 1812 of the PCB boards 1810B positioned within the cavity 1808. As illustrated, the electrical connectors 1816 may be female connectors configured to receive male pins 1812 of the PCB board connectors. In some embodiments, the connector receiver cavity 1818 can include individual holes therethrough for individually receiving one of the male pins 1812. The control housing 1802 and/or the cover 1814 can also include a flexible connector retainer 1820 configured for fixedly retaining a connector 1816 once it is inserted into the connector receiver cavities 1818. In some embodiments, each PCB 1810B can include an integrated F-terminal set of pins 1812 that can be individually mounted to the board such that the PCB board 1810B and the connector pins 1812 create an ambidextrous PCB board. This is different than many PCB connections that are configured for a single right or left orientation. In this manner, one or more control printed circuit boards (PCB) placed within the cavity 1808 can universally couple through the connector receiver cavity 1818. Additionally, in some embodiments, the connector receiver cavity 1818 can include keying to selectively receive a correspondingly configured female connector 1816. In this manner the connector receiver cavity 1818 provides for the predetermined orientation of the female connector within the connector receiver cavity 1818 and therefore to an ambidextrous PCB 1810B and F-terminal pins 1812 on the board. The combination of these features, provide for increased operational and design flexibility for the power control unit and the control modules 1810B therein. The control housing 1802 and or the cover 1814 can include a plurality of vents 1822 to enable thermal ventilation as necessary.

In some embodiments, a horizontally mounted control module 1810A or similar device can provide for electrical connectivity through an opening 1823 or with an electrical contact 1824 positioned along the lower portion 1806 such as on the bottom (not shown in FIG. 18 but representatively placed by arrow 1824). Such openings 1823 or electrical contacts 1824 are configured for making electrical contact with a corresponding portion of the base housing when the control unit 1800 is coupled to the base. Additionally, the horizontally mounted control module 1810A can include one or more sensors (not shown) configured and positioned along the lower portion 1806 to sense a characteristic associated with the operation of the control assembly or the base on which the control unit 1800 is positioned.

In some embodiments of the invention, a power control system includes a base having a housing configured for releasably receiving a control unit and a cavity within the housing for receiving a solid state relay having a hockey puck configuration. The base includes an input power terminal for coupling to an input power source, an output power terminal for coupling to a power receiving load, and coupling fixtures for fixedly and electrically coupling to input and output power terminals and control terminals of the received solid state relay. A control unit is configured to control the solid state relay for selectively providing, at least a portion of, the power received at the input power terminal to the output power terminal. The control unit has a housing adapted to be releasably coupled to the base housing. The control unit and base are each configured to electrically couple the control unit to the control terminals of the received solid state relay as a function of the control unit being coupled to the base.

In some embodiments of the invention, a control assembly for use in an integrated power control system has a base including a housing and defines a cavity within the housing for receiving a power switch. The control assembly includes a control module configured for generating control signals for controlling the power switch for selectively providing power to a power load. A control housing is configured for housing the control module and adapted to be releasably coupled to the base housing and is configured for electrically coupling to control couplers on the base housing for providing the generated control signals to the power switch within the housing cavity upon coupling the control housing to the base housing.

Figure 19:
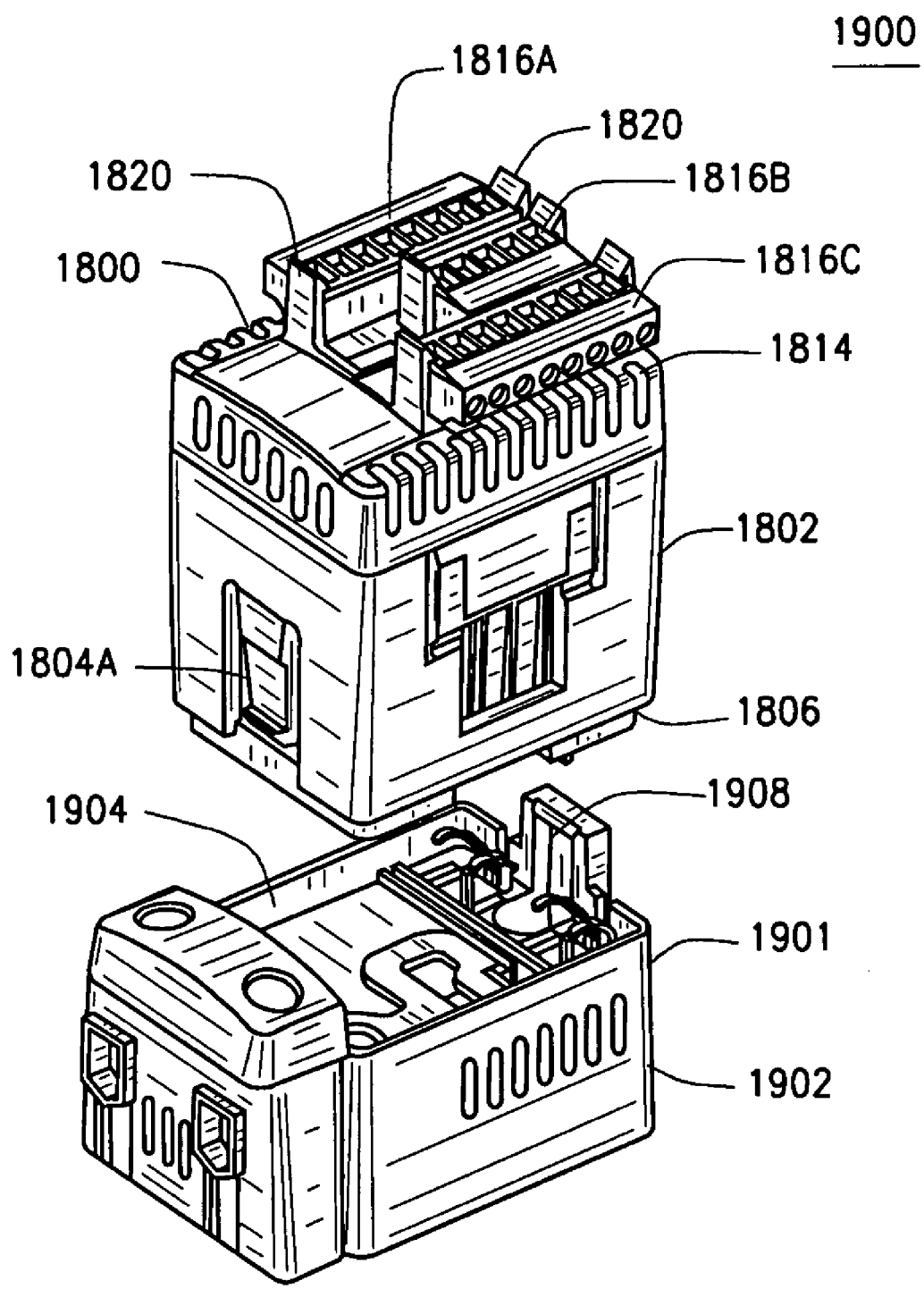
FIG. 19 is a side perspective view of a power control assembly of FIG. 18 configured for coupling to a base housing according to another exemplary embodiment of the invention.

Referring to FIG. 19, the control unit 1800 as described above with regard to FIG. 18 is illustrated assembled with the cover 1814 attached to the control housing 1802 and with a plurality of connectors 1816A, 1816B, and 1816C positioned within the connector receiving cavities (not shown) and retained by the connector retainers 1820. The assembled control unit 1800 is positioned for coupling to a base 1901 having a housing 1902. The base housing 1902 includes a control unit cavity 1904 adapted to receive the lower portion 1806 of the control housing 1802. One or more base fixtures 1908 are positioned and adapted for coupling to one or more of the flexible mating members 1804A for releasably coupling the control unit 1800 to the base housing 1902. As noted above, the base housing 1902 and the control housing 1802 are adapted to mechanically and electrically couple the control unit to the various components of the base housing. Such coupling arrangements will be better understood by referring to FIGS. 20A and 20B.

Figure 20A:
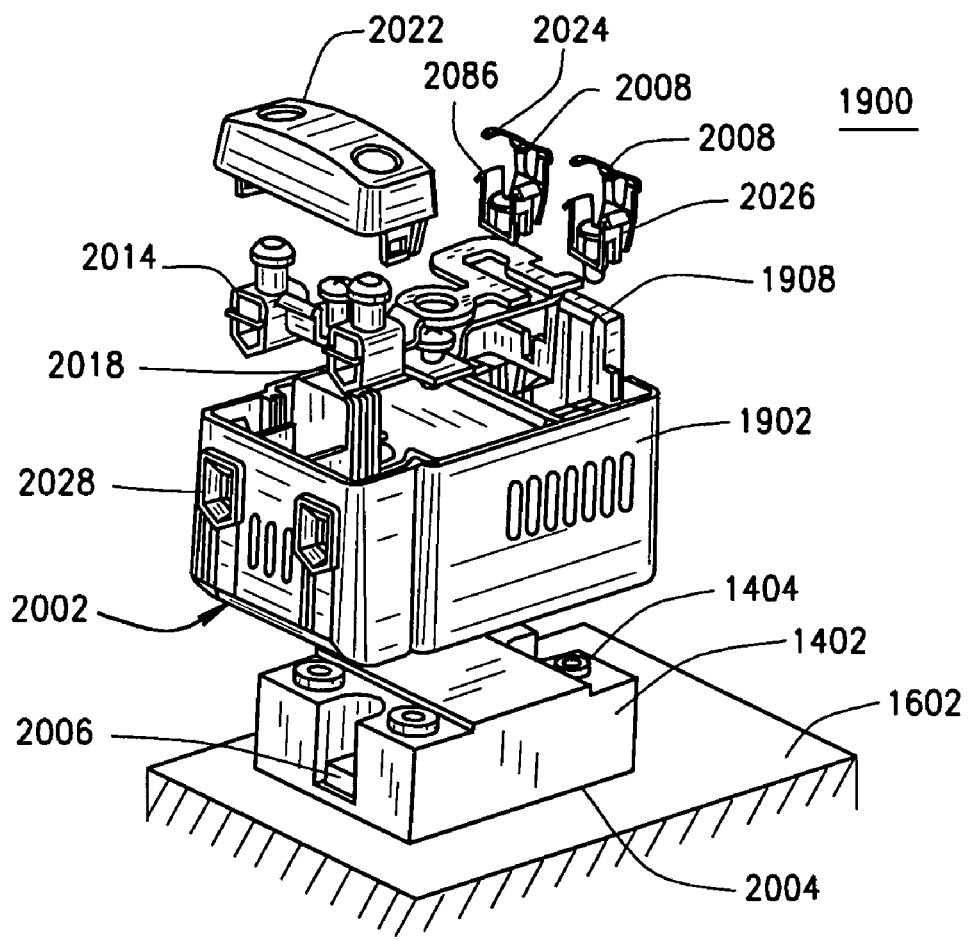
FIG. 20A is an exploded side perspective view of a base housing adapted to receive a hockey puck configured solid state relay according to another exemplary embodiment of the invention.

As shown in FIG. 20A, the base housing 1902 includes a solid state relay or power switch cavity 2002 for receiving the SSR 1402. In this embodiment, the base housing 1902 and the power switch cavity 2002 are dimensioned and adapted to completely receive the SSR 1402, and have substantially the same footprint as the SSR 1402. As noted above, the SSR 1402 is well known in the art to have a hockey puck configuration. The SSR 1402 includes screw seats 1404 for connecting to power and control leads. Also, the SSR 1402 includes a thermal conducting base 2004 and one or more connection fixtures 2006 for fixedly coupling the SSR 1402 and its thermal conducting base 2004 to a heat sink 1602. The base housing 1902 is configured to surround and encompass the SSR 1402 while it is attached to the heat sink 1602. The base housing is configured to receive a variety of SSRs 1402 each having a different height from the electrical terminal to the thermal conducting base 2004 while still ensuring appropriate contact by the thermal conducting base 2004 with the heat sink 1602 and the required electrical connectivity to the screw seats 1404. This can be accomplished by the power switch cavity 2002 and the base housing are dimensioned to have a standard datum for electrical connectivity for the tallest height SSR 1402 while also providing for the SSR cavity depth to enable the shortest height SSR 1402 to extend to contact the heat sink 1602.

Figure 20B:
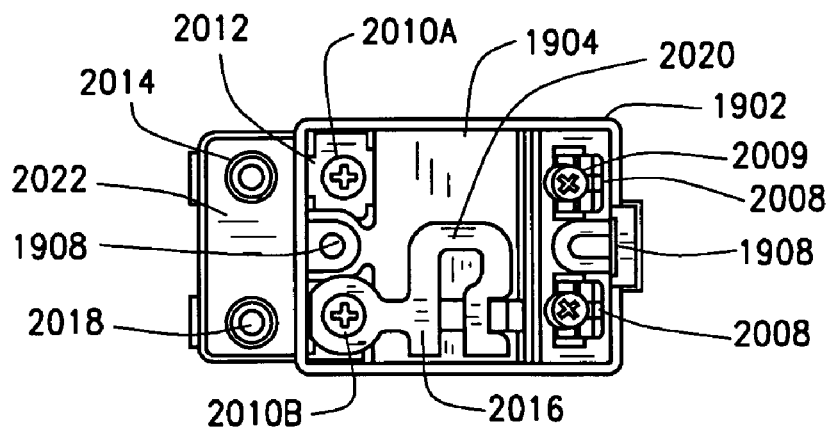
FIG. 20B is a top view of the base housing of FIG. 20A according to one exemplary embodiment of the invention.

Referring now to FIG. 20B, a top view of the base housing 1902 illustrates details of the control cavity 1904 and the electrical features and associated coupling provided by the base housing 1902. A pair of switch control terminals 2008 are positioned for coupling to the control screw seats 1404 of an SSR switch 1402 received within the power switch cavity 2002. In this embodiment, a pair of screws 2009 are coupled to the screw seats 1404. The pair of switch control terminals 2008 can be configured to not only electrically and mechanically couple to the screw seats 1404, but can be configured to fixedly couple the base housing 1902 to the SSR 1402. As shown in FIG. 20A, each switch control terminal 2008 can include a flexible or spring electrical coupler 2024 configured to electrically couple to the control unit electrical couplers 1824 and one or more housing coupling fixtures 2026 configured to couple to a portion of the base housing 1904 when the switch control terminal is fixed to the screw seat 1404 by a screw.

A pair of power terminals 2010A and 2010B are configured and positioned for coupling to the power terminal screw seats 1404 of the SSR switch 1402 by a pair of screws. The base housing 1902 includes a bus bar 2012 for coupling power terminal 2010A to an external power terminal 2014. As will be discussed, the bus bar 2012 can be configured to not only provide electrical connectively, but also provide for fixedly coupling the base housing 1902 to the SSR 1402. A second bus bar 2016 coupling the power terminal 2010B to a second external power terminal 2018. The second bus bar 2016 can also be configured to fixedly couple the base housing 1902 to the SSR 1402. The second bus bar 2016 can also include a current sensing portion 2020 and is configured and positioned for providing a current for sensing by a current sensor associated with the control unit 1800 when the control housing 1802 is positioned with the control cavity 1904. A power terminal cover 2022 can provide for covering the external power terminals 2014 and 2018 to provide additional safety in the presence of unsafe power loads. As shown in FIG. 20A, the first and second external power terminals 2014 and 2018 can include a coupling fixture for fixedly coupling to a wire or electrical conductor. Additionally, the base housing 1902 can also include an external connection cavity 2028 configured about the external power terminals 2014 and 2018 for receiving on of the wire conductors coupled to the power terminals 2014 and 2018.

In another aspect of the invention, a power control system includes a base having a housing for releasably receiving a control unit and defining a first cavity for receiving a power switch, a second cavity for receiving a definite purpose contactor, an input power terminal, an output power terminal coupled to receive switched power from an output terminal a received power switch. The base also has control couplers for coupling to an input and an output control terminal of the received power switch and a plurality of electrical connections. A definite purpose contactor is located within the second cavity and is coupled by a portion of the electrical connections in series with the input power terminal, an input terminal of the power switch received within the first cavity, and the output power terminal. A control unit is configured for providing control signals to the definite purpose contactor and control signals to the received power switch for selectively providing, at least a portion of, the power received at the input power terminal to the output power terminal. The control unit has a housing adapted to be releasably coupled to the base housing. The control unit and base being configured to electrically couple the control unit to the control terminals of the received power switch as a function of the control unit being releasably coupled to the base. The control unit includes a limit component having a limit function characteristic wherein the definite purpose contactor control signals are a function of the limit function characteristic.

Figure 21:
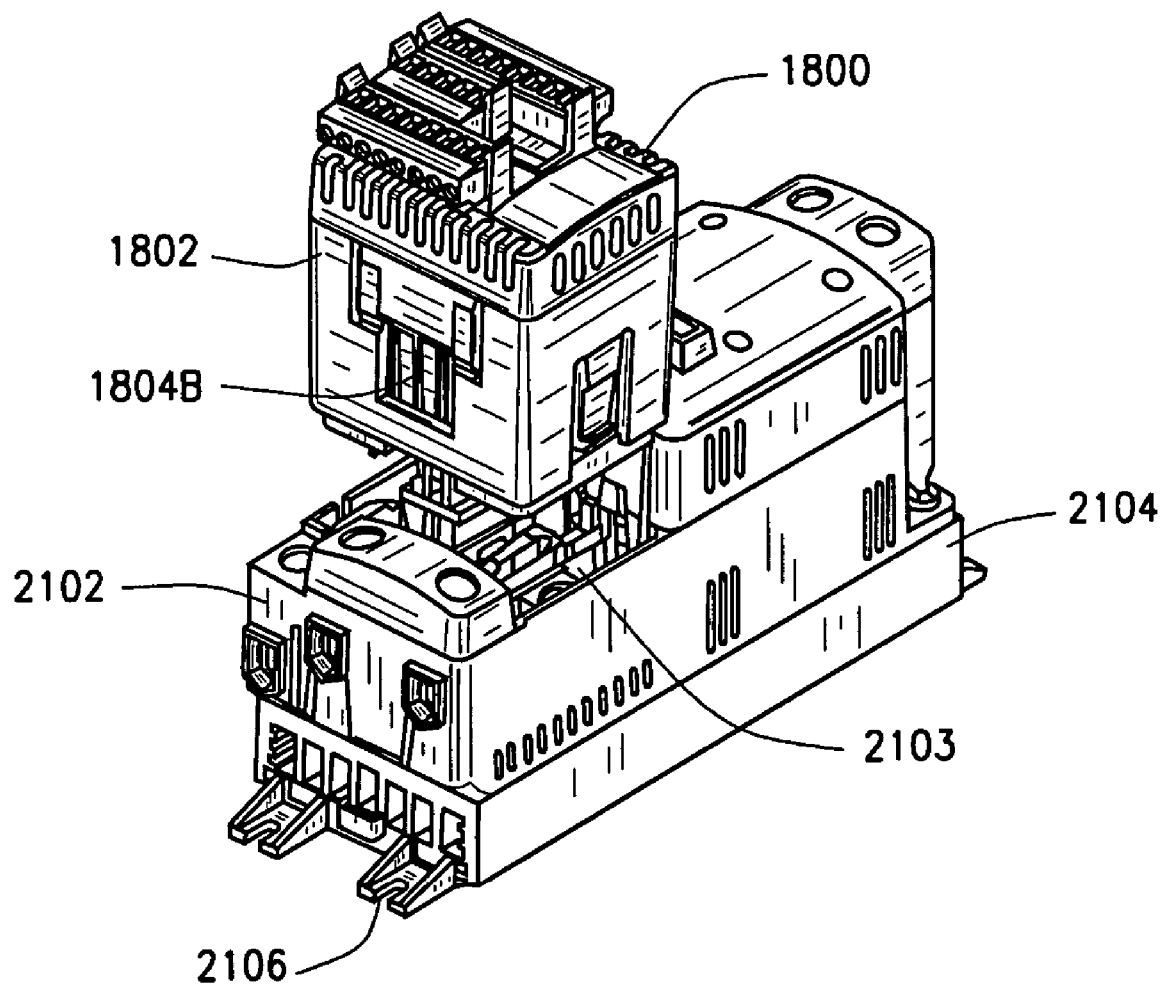
FIG. 21 is a side perspective view of the control unit of FIG. 18 coupling to a base housing configured with a contactor and hockey puck solid state relay according to another exemplary embodiment of the invention.
Figure 22:
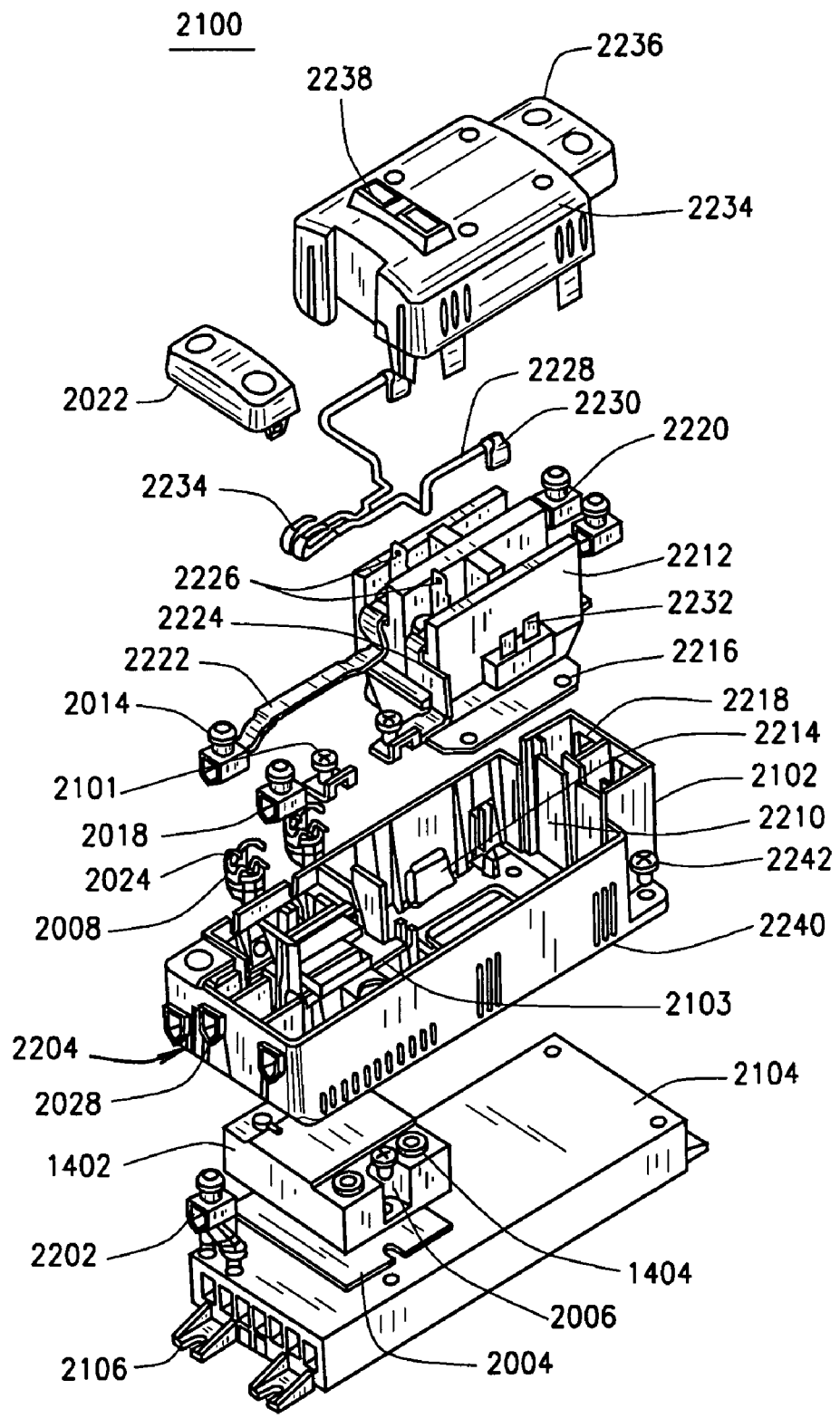
FIG. 22 is an exploded view of a base housing as shown in FIG. 18 according to one exemplary embodiment of the invention.

Referring now to FIGS. 21 and 22, a power control assembly 2100 similar to the power control assembly 1900 of FIGS. 19 and 20 is illustrated. However, the power control assembly 2100 includes a contactor within the base housing as an added power switching function. A base housing 2102 is configured to releasably couple to the same power control unit 1800 within a control cavity 2103 and as generally described above to include keying, coupling, and interoperability. However, in this arrangement, the power control unit 1800 and the base housing 2102 are configured to orient the power control housing 1800 at a ninety degree orientation with regard to the received SSR 1402 and the power switch cavity within the base housing 2102. In some embodiments, the coupling between the control housing 1802 and the base housing 2102 utilizes a different set of opposing flexible members 1804B (as compared to the flexible members 1804A of FIG. 19). Additionally, in the power control assembly 2100 an integrated heat sink 2104 and the base housing 2102 are configured to have substantially the same footprints. Additionally, it should be noted that a width of the base housing and the heat sink 2104 can be dimensioned to be substantially the same width of an SSR 1402 received within the power switch cavity of the base housing 2102. Additionally, a mounting plate 2106 such as for screwing the power control assembly 2100 to a mounting surface (not shown) can be attached to an underside of the heat sink 2104. In some configurations, the mounting plate 2106 can also be adapted for coupling to a DIN rail.

FIG. 22 provides an exploded perspective of the power control assembly 2100. A grounding connector 2202 can be provided for coupling a ground to the heat sink 2104. The heat sink 2104 is configured to fixedly couple to the SSR 1404 power switch and to thermally mate with the thermal surface 2004 of the SSR 1404. In this illustration, the SSR 1404 is oriented across a width of the heat sink 2104. As such, the base housing 2102 includes a power switch cavity 2204 (while not shown in FIG. 22, the power switch cavity is shown by arrow 2204) on the underside of the base housing 2102 and across its width such that the control and power screw seats 1404 of the SSR 1402 are oriented ninety degrees from that of base housing 1902 as previously discussed. The base housing 2102 includes similar switch control terminals 2008 that couple to the SSR 1404 and to the base housing 2102 and that include spring or flexible connectors 2024 for electrically coupling to the electrical connections 1824 of the control unit 1800.

However, the power control terminations differ in the power control assembly 2100 since a second power switch cavity 2210 is configured to receive a second power switch, such as contactor 2212. The second power switch cavity 2210 can be open at the top or bottom to receive the contactor 2212. As illustrated, the second power switch cavity 2210 is open at the top and includes a plurality of flexible latching members 2214 configured to couple and engage an engagement portion 2216 of the contactor 2212. The base housing 2102 includes a power receiving portion 2218 that is aligned and configured for receiving wiring connections from a power supply to couple to power input terminals 2220 of the contactor 2212. The power control assembly 2100 includes, at least one, bus bar 2222 configured on the output portion of the contactor 2212 for directly establishing one leg of an electrical connection with the output terminal 2014. A second bus bar 2224 is coupled to the other output leg of the contactor 2212 for coupling the contactor to the input power terminal of the SSR 1402. An auxiliary tap 2226 can also be provided on the output of the contactor 2212 to enable the tapping of a portion of the power switched by the contactor 2212 and providing the tapped power to another external power load or switch. The auxiliary taps 2226 can be separate components or can be integrated into bus bars 2222 and 2224 as shown.

A contactor control lead 2228 is provided to include a contactor coupling fixture 2230 for coupling to a control terminal 2232 for operating the contactor 2212. A flexible control unit coupler 2234 can also be configured and positioned within the base housing 2102 for compressively coupling with associated control leads of the control unit 1800 upon the insertion of the control housing 1802 within the control cavity 2103 of the base housing 2102. A power terminal cover 2022 can be used to cover the power terminals 2014 and 2018. Additionally, a contactor cover 2234 can be configured for covering the second switch cavity 2210 including the contactor 2212 received therein. Additionally, the contactor cover 2234 can include an integrated input power terminal cover 2236 for providing protection to the input power terminals 2220. Further, the contactor cover 2234 can include an auxiliary tap port 2238 configured to allow access to the auxiliary taps 2226 without removing the contactor cover 2234.

As such, the power control assembly 2100 is configured to provide a fully integrated power control over both a SSR 1402 and a contactor 2212, which can be connected in series. Additionally, the power control unit 1800 can include control modules 1810 for controlling the SSR 1402 via control terminals 2008 and a limit or contactor control module 1810 for controlling the contactor 2212 via the contactor control coupler 2234. In this embodiment, the power control assembly 2100 is fully integrated within a platform having a optimal footprint for operating a SSR 1402 and contactor 2212, while providing for the necessary heat dissipation. However, within the power control assembly 2100 no manual wiring connections are required once the SSR 1404 is coupled to the heat sink 2104 and the base housing 2102.

Similarly to noted above, the base housing 2102 and power switch cavity 2204 are configured to receive a plurality of heights of SSR 1402. However, in this arrangement, the base housing 2102 also includes a base housing pivot portion 2240 to enable the base housing 2102 to pivot during secondary coupling by a coupler 2242 at the contactor end of the housing 2102, e.g., the end away from the SSR 1402 and its coupling to the heat sink 2104.

In one embodiment as illustrated in FIG. 22, the current sensor 1824 can sense a current being provided by the SSR 1402 to the output power terminals 2014 and/or 2018. A limit control module that receives a sensed limit characteristic associated with the power load 120 can also control the contactor 2212 as a function of the sensed current. This can provide an additional safety feature to the power control assembly 2100 since the SSR 1402 typically fails in a closed or conducting state. The switch control module that provides the controls signals to the SSR 1402 can determine that its control state is an open mode and determine that current continues to be provided by the SSR 1402. As such, the switch control module can determine that the SSR 1402 has failed and provide an alarm or error signal or message. The limit or contactor control module can receive the SSR failure signal or message, and open the contactor to terminate input power from being provided to the SSR 1402 or from being provided to the power load 120. This interoperability is just one feature and functionality that is enabled by the features and functions obtained by the integrated power control assembly 2100.

In other embodiments of the invention and with reference to FIGS. 18-22, the invention includes a method of assembling a power control assembly including inserting a solid state relay 1402 having a hockey puck configuration into a cavity 1904 or 2103 defined by a base having housing 1902 or 2102, coupling an input power terminal to an input terminal of the solid state relay 1402, and coupling an output power terminal to an output terminal of the solid state relay 1402. The method also includes coupling a first control attachment fixture 2008A to a first control terminal 1404 of the solid state relay 1402, coupling a second control attachment fixture 2008B to a second control terminal 1404 of the solid state relay 1402, and inserting a control unit 1800 having a control housing 1802 onto the base housing 1902 or 2102. The control housing 1802 and the base housing 1902 or 2102 are configured for releasably coupling the inserted control unit 1800 to the base such that inserting a control unit 1800 includes compressively coupling the control unit 1800 to the first control attachment fixture 2008A and the second control attachment fixture 2008B and completing an electrical connection between the control unit 1800 and each of the control terminals 1404 of the solid state relay 1402.

Similar processes and steps of assembly of the power control assembly, according to various embodiment of the invention, such as power control assembly 1900 and 2100 are described above and by FIGS. 18-22, as is known to those skilled in the art of such assembly.

In some embodiments, the components and modules of a power control assembly include various features, due at least in part, to the above described system integration and component processing functions. In yet other embodiments, the power control assembly includes a sensor multiplexer that can include a multiple channel switch to combine multiple sensor inputs to a single analog/digital A/D channel. In one arrangement, a first multiplexer is coupled in parallel with a second multiplexer. These multiplexers receive control signals from independent channel select circuits. The inputs of these multiplexers are used to determine limiting actions of a limit component. Where two multiplexers are connected and controlled in this arrangement, the limiting component determines if the channel selection circuits are performing correctly. If the channel selection circuits are performing correctly, the resulting input to the A/D channel will produce an OPEN sensor condition. From this signaling, the limit control component can apply the limiting function.

As discussed, the integrated mechanical and electrical connectivity of the power control assembly and between components or modules within a power control assembly provides for improved connectivity by reducing user interaction due in part to a reduction in the number of connections or connection points, and improving the reliability of the remaining connections. The inter-component connectivity provides for improved communication that enables internal system diagnostics, configuration management, system and component administration, advanced functionality, mechanical alignment, and custom designs, as some examples. Additionally, the inclusion of component or module processing systems within components provides for higher level functionality with each component and within the unit or system. These include, among other features, data modeling, system modeling, and system configuration management.

In another embodiment, connections or terminals for connection to external devices, such as sensors, can utilize a gang connection. A gang connection provides for ganging of a plurality of devices with minimal user involvement and within minimal space. In such arrangements, the ganging of devices such as sensors onto common terminals or connection points reduces the overall number of connection points and possible points of failure.

In another embodiment, a customized or proprietary SSR configuration or connection method can be utilized and configured within one or more embodiments of the power control assembly. In embodiments of the SSR power control assembly, one or more components can provide an electrical ground or the ground can float. In the described SSR embodiments, the power control assembly provides multi-component coupling under continuous compression such that per-module or per-component user interaction or input is not required with regard to the various connections there between.

In another embodiment, the combination of the power switch and limit contactor can be arranged so that the limit switch and power switch are combined in a parallel circuit to the power load. In such an embodiment, the power switch acts as a primary load switch during the connection or disconnection of the power supply to the power load. This embodiment can provide a no-arc feature. This embodiment includes the same attributes of reduced wiring and wiring mistakes in addition to the benefit of no arcing.

Components and modules of the power control assembly can include one or more devices such as a circuit or processing system that requires device powering. In such cases, device powering for internal system operations can be obtained parasitically from the supply power received from the power supply, can be received from a dedicated power supply input, or can be powered from the communication link such as a WatBus™. In many embodiments, these device power requirements are often very low and require very low currents. In another embodiment, the same low current for operating or actuating the power switch relay to drive the high current contactor can be used for device powering.

In some embodiments, one or more of these internal and external connections can include a sensor, monitoring, or feedback mechanism to provide the power control assembly or system, a remote monitoring system, or an operator of the assembly with feedback relative to connection integrity pursuant to a predetermined standard or characteristic such as torque. One or more connection characteristics can be identified and one or more operational operations such as an alarm indication can be initiated in response to the connection characteristic. In another embodiment, system or component diagnostic operations or processes utilize one or more of the characteristic to provide intra-power control assembly connection diagnostics for trouble shooting, trouble isolation, configuration management, and maintenance.

One or more components have operational or communication interfaces for communicating with other components within the power control assembly and system. Each component can have a plurality of versions or models having different combinations of features, functions and modules. However, within the power control assembly, each model or version of each component will connect with and operably couple to any and all models and version of any other component. As such, each version or model of each component can be utilized in the power control assembly and combined in a flexible manner to address the requirements of a user application for the power control assembly. Additionally, all or fewer of the components within the power control assembly can be both backward and forward compatible in conjunction with the inter-component connectivity and component self-identification.

In some embodiments, the power control assembly as described herein will enable a user to easily identify individual components and modules within the power control assembly.

In another embodiment, the integrated combined power control assembly includes an integrated thermal heat transfer management. Each component of the power control assembly includes a heat transfer assembly, that when assembled with other components conducts heat to one or more heat sinks. In one embodiment, a unit can utilize the power switch component as a unit heat sink, as the power switch component can include an integrated heat sink or configuration in conjunction with a mounting of the power switch component. In another embodiment, one or more components of the unit can include or be comprised of a thermally directional material that can act as a unit or component heat sink. Such a material can thermally operate similar to a diode's electrical operation by blocking the transfer of heat in one direction and allowing heat to transfer in another direction. In one embodiment, the thermally-directional material can act like a funnel and transfer heat from a component within the unit to a component having a larger surface with superior heat transfer thereby improving heat transfer and minimizing heat build-up within the unit overall.

In some embodiments, the inter-component and/or inter-module connections within the power control assembly include integrated Electromagnetic Force (EMF), Electromagnetic Interference (EMI), and thermal shielding for each of the components and the power control assembly as a whole. In one such embodiment, a power control assembly housing or cover can be integrated into each component such that when combined an integrated housing provides one or more of these shielding functions. Additionally, the housing can also inhibit operator interference or contact with wiring, connections, or critical components. In one embodiment, the housing or means for engaging an interconnecting wire to the unit or component can inhibit the physical movement of the wire lead that becomes disengaged from a connector of the power control assembly or a component thereof.

For example, in some embodiments of the integrated power control assembly, one or more housings provide for the mechanical and electrical connectivity of the various components. Such housings can be comprised of a molded or machined material such as plastic, by way of example, that provides the relationship between the geometries of the power switch (shown as an SSR or contactor), the control, and the limit components and include air duct geometry suitable for convection air flow. These combined housings, when assembled, can provide an air duct that will channel air flow vertically over the top surface of the power switch component. The air flow originates from inlets located vertically below the power switch heat generation point. This air flow is further entrained vertically through the power control assembly via air flow rib geometry formed within the plastic part geometry. The orientation of the ribbing and corresponding inlet and outlet vent openings promote an increase in air flow velocity due to the greater volumetric expanse in the duct area directly (vertically) above the power switch heat producing area. The natural convection is enhanced by the component geometries and promotes an increase in air speed as the air passes from the constricted area at the power switch upward to an ever increasing open area (the rib area) to the outlet vent points. The plastic embodiments and the adjacent power switch module provide the duct geometry necessary to enable this thermal management mechanism. This particular embodiment enables improved power switch cooling as compared to conventional assemblies.

In one embodiment, the power switch component can be a contactor module having an integrated integral line voltage and/or load current sensing module and functionality. In another embodiment, the power switch component can include an integrated limit switch module. In one or more embodiments, the power switch or contactor component provides for selectively providing power from a power supply to a power load. The contactor component with the limit module would also provide a limit switching function as a function of a predefined threshold limit. Such a limit module can include a temperature sensing function or can be a voltage or current sensor. As just one example, the limit module can utilize a current monitor including a current transformer, Hall Effect sensor or GMS device—non-circuit breaker style, as are known in the industry.

Some embodiments include one or more sensor interfaces for communicating with an external sensor sensing an external operation associated with the user application or operation. In another embodiment, the sensor can be integrated, at least in part, into the power control assembly. In some cases, the sensor can provide or the power control assembly can determine the type of sensor interfacing with the power control assembly. In such a case, the power control assembly can adjust or reconfigure one or more operating parameters, a profile, or a configuration as a function of the sensor type. As just one example, the power control assembly can determine the type of sensor and optimize a function or interface to one or more temperature scales or ranges in order to optimize the performance of the temperature measuring function or the power control function associated with the temperature measuring input.

Each component of the power control assembly provides interconnecting components with component data for self-identification such that the interconnecting components are provided component identification data related to all interconnecting components. Such component data can be communicated via the communication link, via a proximity switch or recognition device, or via another interface including a user input interface.

The component data can include the type of component, the model number, manufacturer, software version, features, functions, serial number, profile, configuration data, component module data, customer application data. Additionally, one or more components of the power control assembly can provide component data and data associated with itself and all interconnected components to a third component thereby providing for the dissemination of component data throughout the components of the power control assembly. As such, each component detects and identifies every other component within the power control assembly. Such information can be stored in a memory of each component and can be used to update a profile or configuration of the power control assembly. Additionally, previous or predetermined component data, configuration data, or system profiles can also be stored for comparison, for reference, for selection, or as a default.

Figure 23:
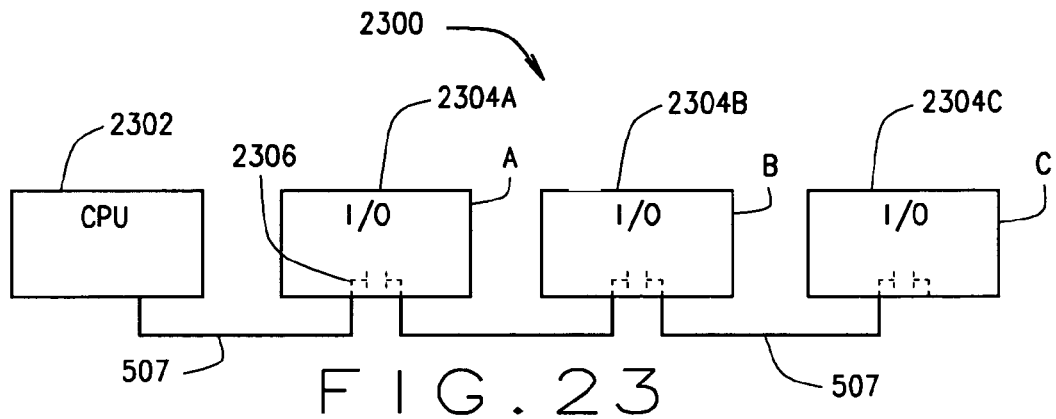
FIG. 23 is a block diagram of a control communication scheme for a power control system according to one exemplary embodiment of the invention.
Figure 24:
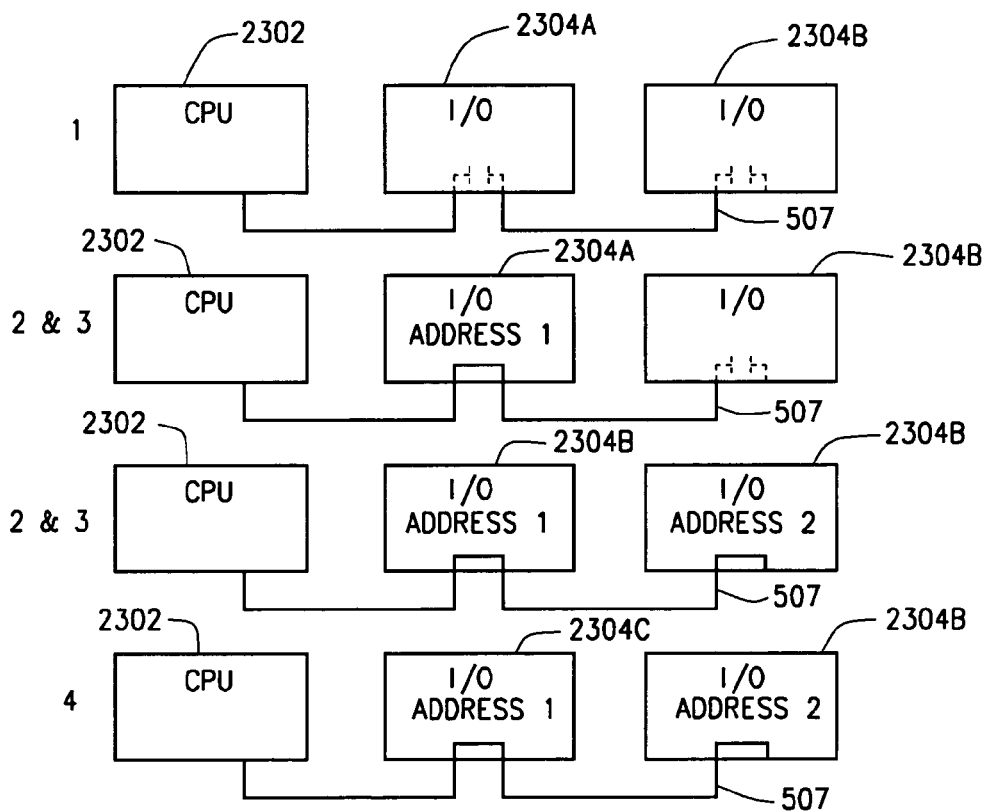
FIG. 24 is a story board illustrating a communication process flow for plug and play capabilities for a power control system according to one exemplary embodiment of the invention.

In some embodiments, the power control assembly and/or system includes a self-identification capability and its integrated functionality. As illustrated in FIGS. 23 and 24, a power control assembly 2300 having a CPU 2302 is operably connected to input/output modules 2304A-C having connectivity gates 2306A-C that are associated with a plurality of components comprising the power control assembly 2300. Prior to power-up of the power control assembly, each of the connectivity gates 2306 in the components are open. Upon power-up, the power control 2302 broadcasts a message over the communication bus 507 to each of the I/O modules 2304. One such message can be a "next mode" message. The first physically connected I/O module 2304A receives the message and extracts its node address from the message. In response, I/O module 2304A closes its associated gate 2306A thereby connecting a second module 2304B to the communication bus 507 and to the control 2302. The I/O module 2304A sends an "identified message" in response to the next mode message to the control 2302. The I/O modules 2304A can then close itself from future broadcasts. Each of the operations is repeated until all gates 2306 are closed and no response is received by the control 2302, thereby indicating no further components 2304 are connected to the communication bus 507.

A power control assembly or components having component data for each of the components within the power control assembly can access the data and determine an operational or diagnostic operation in response. This can include providing feedback, initiating instructions, initiating diagnostics, initiating maintenance, initiating an alarm or a message consistent with best practices, optimal profiles, or preferred configuration or setup.

Figure 25:
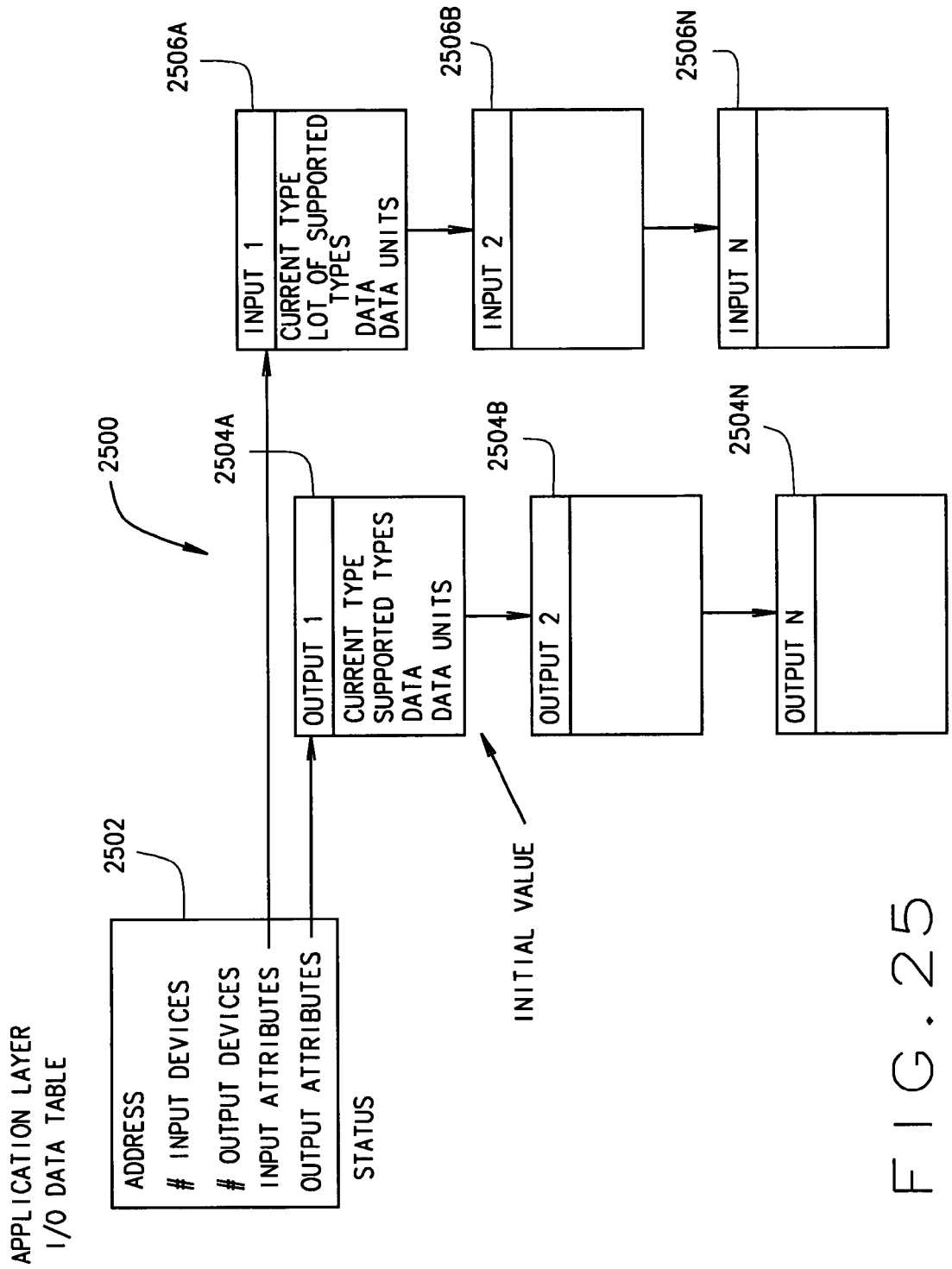
FIG. 25 is a block diagram of an input/output data table for a power control system according to another exemplary embodiment of the invention.

The integrated power control assembly according to some embodiments of the invention can generate an input/output configuration list during power control assembly initialization. An input/output header can be generated and I/O data obtained for a first component in table 1 and for a second component in table 2. FIG. 25 illustrates some embodiments of such an input/output data table 2500. As shown, the component data table 2502 includes a data address for each component on the communication bus 507. Additional data items can include an identification of the number of associated devices having inputs and outputs, the input attributes, and the output attributes, by way of example. For each output 2504A-N and each input 2506A-N, an attribute can include a type, a list of supported types, data, and data units for each input. These can be associated with an initial or default value or be associated with a particular user application.

In this manner, upon receipt of the interconnected component data, a component can analyze its operations and the operations of the power control assembly to ensure that effective and efficient operations and interfaces are provided by the combination of components comprising the power control assembly. Additionally, the component can activate or deactivate features and functions consistent with the capabilities of the interconnected components or the power control assembly as a whole. In this manner, the power control assembly can reconfigure to maximize the functionality of the power control assembly based on the capabilities of each and every component. One or more components can adjust a parameter, operation, or interface as a function of the received interconnected component data.

Additionally, utilizing the communications bus 507 and interfaces, two interconnected components can negotiate with each other in establishing an optimized or predetermined interconnection. Such negotiations can be a function of algorithms, tables, or decision flows or diagrams.

As all component data can be available to each and every component within the power control assembly, each component and the power control assembly or power control system (having multiple power control assemblies) as a whole can self-configure as a function of the available component data. Such self-configuration can be initiated at initial system setup, upon installation of an additional or replacement component, upon occurrence of an event such as an error, or reboot, or as a function of receiving a re-configuration input from a user or a remote system. For example, a second component can be replaced by a second component of a later version having additional functionality. As such, upon insertion of the replacement second component, the other components within the power control assembly can recognize that the replacement second component has the new capabilities and as a result activate dormant capabilities within their own components.

Additionally, as each component within the power control assembly can have knowledge of interconnected components, the component can include operational data related to those interconnected components such that it can determine, estimate, or infer the status or activity occurring in the interconnected components or within the power control assembly as a whole, without actually receiving an indication or message. By utilizing the component data, one or more components can produce high level diagnostic, analysis, parameters, and characteristics thereby providing for improved high level control of system level diagnostics and operations.

In one exemplary embodiment of self-recognition, a physical proximity of one component to another component within the power control assembly or system can self-enable features and functionality. By way of example, a physical proximity switch can be a magnetic switch. For example, a first component can include a magnetically operated switch positioned to recognize a magnet associated with a second component such that when the first and second components are combined in a power control assembly, a circuit in the first component is completed thereby providing for a proximity indication in the first component that the second component is coupled thereto. When such a proximity indication is present, one or more features in the first module can be enabled or disabled.

As one example of such an embodiment, a limit controller within the power control assembly can have set a limit responsive to a particular heater type being controlled. In response, the controller within the power control assembly sets a high setpoint limit. As another example of one embodiment, a PID controller adjusts for a change between a setpoint and a limit setting such as to minimize or eliminate an overshoot that would produce or result in a limiting action.

In yet another embodiment, when the power control assembly, system or a component cannot self-configure or has an error, a component can utilize the stored data to one or more components having the stored component data for reconfiguration. In such a case, one or more components can access one or more default or prior configurations, information or profiles, to provide a recovery of the component by replacing the current configuration, information or profile with a default or previous profile or configuration.

In another embodiment, the power control assembly can identify the type of heater or operation of the heater and recommend or determine a preferred or desired startup or operational feature to an operator or another components, system or power control assembly, such as recommending a soft start or slower ramp rate or to initiate another operation such as a bake out. As another example, a temperature range or power level can be determined as a function of a sensor type to provide for improved control.

In another embodiment, the power control assembly can automatically reconfigure to optimize performance to sensor type or operation or to a particular temperature scale or range for a sensor or sensor type. As one such example, a power control assembly can have a plurality of sensors associated with it. In one arrangement, the plurality of sensors can include different sensor types such as a Type K sensor and a Type E sensor. The Type K sensor and the Type E sensor can be arranged in parallel. For controlling one or more operations of the power control assembly or components thereof, the system can utilize the signals from the Type K sensor over the full operating range, but utilize the signals from the Type E sensor over a controlled range to provide improved temperature identification and resolution.

As an example in a heater element load application, a thermocouple can be utilized to control temperature. However, the power control assembly can utilize or switch to another sensor or sensor type to improve system measurement at critical control points or ranges. For example, at a critical point in the operation or control by the power control assembly, the system can utilize a pressure or flow sensor rather than the temperature sensor.

In another example, the power control assembly can include a plurality of sensors and sensor types. A transition between one sensor type to another sensor type can be controlled using a control method, by way of example, a proportional allocation method or algorithm, so as to manage, reduce, mitigate or smooth over sensor and switch disturbances. For example, the switch over from 100 percent from sensor A to 100 from sensor B would be ramped or variably controlled through ranges from 0 to 100 percent at various incremental amounts.

In yet another embodiment, a control component is configured to monitor an independent temperature sensor and a limit component is configured to monitor a second independent temperature sensor. The limit component compares temperature information of its sensor with that of the control component's sensor. If the difference is determined to vary more than a predetermined amount, the Limit component initiates an action such as a corrective or notification action. This embodiment provides a redundant method of insuring the thermal system remains in a safe temperature condition.

In another embodiment, a component within the power control assembly can include a wiring auto-correction capability. The component can have one or more wiring connections that are wired during installation by a user. However, some wiring connections can require a particular wiring order or polarity. In such a case, the component can test or sense the wired connection and identify that one or more of the wiring terminations are incorrect. The component or system can provide an indication to the user such as a light or message. In other embodiments, the component can reconfigure the interface or internal connections or logic path such as to swap, exchange, or reverse the mis-wired connections without user involvement. As one example, a sensor can have polarized leads. When the sensor leads are connected on a connection terminal of the power control assembly or component, the component can sensor the incorrect polarity and swap the leads automatically to correct the mis-wiring and to provide for continued operation without user involvement.

As discussed, each component of the power assembly or power control system can include a processor, memory, and/or communication interface. In some embodiments, one component can not only monitor or identify an occurrence within its own operation, but also have knowledge of present and past occurrence of one or more other components comprising the power control assembly. These can include occurrences of diagnostic parameters such as a change of a state, a change of a mode, a change of a status, a failure, a change of a field parameter, a change of the field operating characteristic, a value of a field parameter crossing a threshold, an alarm, an alert, and a value of the field operating characteristic crossing a threshold.

As such, a component of the power control assembly can include one or more system or component diagnostic modules for diagnosis of an operation or status of the system or component. In one exemplary embodiment, the diagnostic can include a parameter associated with a calibration, a profile, a configuration, a system administration, and a system operation.

The diagnostic module can include an algorithm, a program, an artificial intelligence module, a modeling module, a mapping, a graphical analysis, a rule, a comparator, and a look-up table, by way of example, for diagnosing the system or component. In one such embodiment, the diagnostic module can include a neural network, an empirical data, a numerical data, a fuzzy logic circuit, a neural fuzzy circuit, a polynomial algorithm, a residual life algorithm, an artificial intelligence module, a modeling module, and a statistical function.

In another embodiment, the power control assembly or component can similarly provide other internal functions including a trouble shooting method, a fault detection, a fault isolation, a root cause, a setting, a limit, a threshold, a calibration, a failure prediction, a maintenance procedure, a validation, a verification, a traceability, an auto-configuration, an architecture alignment, a fingerprint, an identification, a theoretical modeling, a self-administration, and a self-tuning rule.

As another example of some embodiments of a power control assembly diagnostics, the control assembly can include one or more temperature measurements for measuring the heat transfer from the power switch to the associated heat sink, the temperature of a wired connection, or the temperature of an interface.

In another embodiment, the power control assembly or one or more components thereof can reconfigure an interface, parameter, or process on a temporary basis to place modules, components or power control assemblies in a test or diagnostic arrangement. For instance, one or more components can be placed in series to isolate a trouble through a process of elimination. As one example, in a power control assembly embodiment, a fuse, power switch, limit switch, and protection device can be placed in series with the source voltage and the interconnection points between each of the components tested to identify which component failed.

One embodiment of the power control assembly provides for a connection or assembly of components that includes a signal or indication that the assembly was correctly and completely assembled and that all required terminations and connections have been made and are suitable for operation. The indication can be an electrical signal, a message, a beep or audible indication, a light, or a flag.

In some embodiments, the power control assembly can include initial and ongoing power loop system verification, for example, verification of the thermal loop when powering a heating element.

After components of the power control assembly and/or its components are assembled, the power control assembly can automatically or upon user initiation, self-verify component coupling and proper functionality prior to activation of application power or providing of power to a power load. For example, when a power control assembly is first assembled, each of the components self-verifies proper internal operations and configurations and also verifies proper connection and characterization alignment with the other components such that the combination of components provides the required system level profile and characterization. Each component, the power control assembly, or the power control system can also verify that each and every connection, including the power supply and power load connections, are secure and within predefined specifications. After these verifications are complete, the limit module and/or the power switch are authorized or enabled to initiate a powering mode for providing supply power to a power load served by the power control assembly or loads served by the power control assembly. Such verifications can be at system installation, system powering, at other pre-determined events and times, when an alarm or error occurs, at regular intervals or continuously, by way of example. Additionally, in some embodiments the power control assembly can include an indicator such as a flag or light or signal such as a green light to indicate proper connectivity and installation and/or a flashing green light to indicate proper polarity has been achieved if required in a particular connection.

Additionally, when a verification results in the identification of a verification issue, the power control assembly, a component thereof or a power control or operational system can initiate a component level or system level diagnostic or maintenance routine to determine the source via self-initiated trouble shooting. In some embodiments, the assembly can also reconfigure to eliminate or isolate the problem when possible.

As an example of one embodiment, the power control assembly can verify that all power connections are secure to ensure proper connection. The control can compare the recent reading with a previous reading and identify a degradation of the connection as might be indicated by an increase in the temperature, an increase in the voltage differential across the connection, or detect an increase in the deflection or strain of a power supply line or power load line. When a problem is identified, the system can diagnose the potential power lead failure prior to failure and initiate a preventive maintenance action or routine or can provide an alarm, indication, or message to prevent a failure that causes an out of service condition.

In some embodiments, the power control assembly can utilize the integrated nature of the power control assembly to provide new and novel power control functions and functionality. As one example, a power control assembly of the power control system can provide a new limiting function not previously provided by temperature-only power limiting devices. By leveraging the integrated nature of the power control components within the power control assembly, power control operating characteristics or operating events in addition to temperature can be sensed or identified. The limiting function of the limit module can be based at least in part on one or more of these power control operating characteristics and/or operating events.

The temperature sensor associated with the limit module can be any sensor configured to sense a temperature, including a thermocouple, a resistance temperature detector (RTD), a diode, a semiconductor sensor, a resonance temperature sensor, an infrared sensor, a thermistor, and a transistor.

The power control assembly can also include sensors to measure other characteristics or to identify the occurrence of an event, including a pressure sensor, a flow sensor, a stress sensor, a motion sensor, a position sensor, a voltage sensor, a current sensor, a Hall effect sensor, a magnetic intensity sensor, a gas sensor, and a chemical property sensor.

The power control operating characteristic can include a resistance, a current, a voltage, a Hall effect voltage, an energy, a mass, a power including an electrical power, a capacitance, an inductance, a reluctance, a phase, a timing, a frequency, a time, a mode, a status, a failure, a position, an alert, an alarm, a state, a magnetic intensity, data, and a parameter.

The power control assembly or system operating event can include a change of a state, a change of a mode, a change of a status, a failure, a change of a field parameter, a change of the field operating characteristic, a value of a field parameter exceeding a threshold, an alarm, an alert, and a value of the field operating characteristic exceeding a threshold.

Additionally, by utilizing the communication bus 507 of the power control assembly, the limit function can receive an operating characteristic or event occurrence indication from a field device that is external to the power control assembly but that can be associated with the user application of the power control assembly. The communication can be received, either directly or indirectly from an actuator, an accelerometer, a valve positioner, a gauge including a pressure gauge, a solenoid, a power supply, a heater, a valve including a solenoid valve, a meter, a motor, a pump, a switch including a thermal switch, a fusible link, and a memory device. Additionally, the communication can be received from a fabrication system, a manufacturing system, an assembly system, a processing system, an operational control system, an asset management system, a maintenance system including a predictive maintenance system, and a supervisory control and data acquisition (SCADA) system. In such embodiment, the limit function may, at least in part, be a function of the received communication.

As with temperature-based limit system, one or more of these characteristics, parameters, or events can be combined in a table, algorithm, or other determination to ensure power control assembly integrity, application operational integrity, as well as providing improved efficiency and safety.

In one embodiment, the limit function provides an operating limit to the supply power through inter-module connectivity and communication. When an operating characteristic or operating event indicates a limit occurrence, state, or status, the limit on providing power to the power load remains disengaged, thereby preventing operation of providing power to the power load. The system monitors the power control assembly and only disengages the limit function when a no limit situation is present. This can be when all power control assembly components and power control system units or assemblies are operationally ready, or when a predetermined limiting situation is cleared.

The power control assembly can as sense data and provide feedback for comparison of actual to expected values. In such a case, the assembly or a control components associated with the assembly can determine the difference and take an appropriate or determined action as a function of the determined difference. This can include the determination that a material buildup is occurring on the limit sensor or the control sensor which can impair the ability of the sensor.

In some embodiments, a component or operation of a component or system can also utilize the component status data and information for improving one or more operations. For example, if a limiting action occurs in the limit component during a control function of the controller such as a PID, the controller component can suspend the integral windup condition or another operation until the limiting action in the limit component terminates. In such a manner, the status of one component within a power control assembly can improve an operation within another component, thereby improving the overall performance or operations of the entire power control assembly.

These operations can include locking out or preventing an operation of or by one component or sub-component or modules as a function of an occurrence, a status, an alarm, an operation, a process, an error, a current, or a voltage, by way of example. In one application of this, the controller can lock out a defrost mode or operation during a control component being in the middle of an operating procedure.

In yet other embodiments, a user application can require that the power control assembly provide power to a plurality of associated power loads. In such a case, a plurality of power control assemblies can be arranged in a power control system to have a corresponding relationships with the plurality of power loads. The power control assembly can be configured to ensure that each and every power control load operates in a predetermined manner. The power control system interoperates with the plurality of power control assemblies to monitor the power control loads to ensure that user application requirements are met.

As one example of an embodiment, a plurality of power control assemblies of a power control system can be configured to provide power to a series or group of heating elements in a user thermal application. The user application can require that the heating of the application be consistent and even whereby no hot spots are present. However, each heating element can have a different heat transfer property due to the age of the heating element or the mounting arrangement. However, a sensor associated with each power control assembly can monitor the thermal heat generated by each heating element and provide the temperature data to the power control system. The power control system can determine that the power to one or more heating elements can need adjustment up or down to ensure a uniform and consistent heating application.

In another embodiment, the user application can have a staged loading to minimize peak power and loading as a function of an efficiency or optimization determination. In such an embodiment, the power control assembly can include a program or algorithm such as to appropriate stage the powering of the power load devices.

In one embodiment, two components or modules thereof of the power control assembly can be configured to share resources in defined configurations or situations to provide for enhanced features and functionality and reliability of the system. For example, in one embodiment of a power control assembly within a power control system, the unit can include a limit sensor and a control sensor. The system can determine during operation that the control sensor has failed or is not functioning properly. In such an embodiment, the system can disconnect or ignore the control sensor output and utilize the limit sensor as a control sensor. As another example, the power sensor can be utilized as a control input during manual power when the control sensor fails. In such embodiments, the power control assembly or a unit or component thereof can continue to operate and provide power control functionality even when an otherwise essential element within the power control loop has failed. The system can also provide an indication, an alarm, or a message indicating the failure and the failure mode operation.

In another embodiment, power control assembly can include a plurality of power control assemblies. In some embodiments, the plurality of power control assemblies can have a common control module, e.g., one power control module providing control functions to each of the plurality of power control assemblies. In such cases, the common power control module provides for interoperability and management of the power control assemblies comprising the power control system. This can include unit to unit communications and communication management, profile sharing, configuration sharing, storage of one or more profiles, configurations, characteristics, and/or parameters. This can also include an application profile or a user profile. The controller can also enable unit to unit configuration management and system configuration management.

In some embodiments, the plurality of power control assemblies can have a common user interface, e.g., one user interface providing user input and feedback for controlling each of the plurality of power control assemblies.

In some embodiments, one or more of the plurality of power control assemblies can be associated with a different and/or related portion of a user application. Additionally, a plurality of power control assemblies can be associated with a plurality of user applications, some of which can be associated user applications.

By way of example, a first power control assembly provides power control to a first zone, a second power control assembly provides power control to a second zone, and a third power control assembly provides power control to a third zone. One or more of the zones can be associated or have a relationship within the user application.

A user application profile or configuration is defined to include one or more power control assembly profiles and configurations. The user application profile defines a user application profile; however, one or more of the power control assembly profiles can be configurable during operation as determined to ensure that the user application profile is continuously met. Each of the power control assemblies monitors not only their own internal power control assembly modules and interfaces, but can also monitor one or more functions, modules, or interfaces associated with one or more of the other power control assemblies comprising the user application and included in the user application profile. By utilizing information associated with the user application profile, a first power control assembly can be associated with a first process that is experiencing delays or other problems. In such a case, one or both of second and third assemblies can self-reconfigure an operation, their profile, or their configuration in response to the first power control assembly operations such as to ensure that the overall profile or configuration of one or more user applications is achieved and that the relationship between the zones is addressed.

In one exemplary embodiment, the operation of one power control assembly is adjusted as a function of the relationship between the zones or associated user applications of the plurality of power control assemblies. Knowledge regarding the relationship provides for detection of deviations in other zones or power control assemblies, and adjustment to one power control assembly can be responsive to deviations of one or more other power control assemblies or user applications (such as a zone) associated with another power control assembly.

Such power control assembly adjustments or reconfiguration can be made without direct sensing or monitoring of one or more parameters or characteristics of another power control assembly. This can include a failure in the user application and not necessarily the associated power load device or the associated power control assembly.

As discussed above, one or more aspects and features of the invention provide for improvements in the operation and capabilities of a power control switch. Some embodiments of the invention include monitoring a heat transfer characteristic or electrical characteristic of the interface between components of the power control assembly and between a component of the power control assembly and an external application component. In one such embodiment, a junction temperature of a solid state device such as a power switch module or component is measured to ensure proper performance within operating specifications and performances. In other embodiments, the temperature of the heat sink can provide a relative temperature that can be indicative of the temperature of the solid state device and the heat sink junction. The measurement of the temperature of the solid state device is determined as a function of the temperature of the heat sink based on intrinsic data, a look-up table, a matching, or an algorithm, by way of example. Additionally, the thermal bonding of the solid state device to the heat sink can be modeled or determined as a difference. If the difference is larger than a predetermined value, this indicates a breakdown in the thermal bonding and therefore a potential source of failure.

In another embodiment, the control assembly includes a temperature monitoring sensor for monitoring the temperature of the junction between the power switch (such as an SCR or SSR) and the heat sink associated with the power switch. In such an embodiment, a sensor can be positioned to directly measure a characteristic of the heat sink junction or a component of the junction (such as the backplate of the power switch or SSR) or a surface or body of the heat sink. While the characteristic of the heat sink junction can be temperature, it can also be a characteristic that varies as a function of the heat transfer characteristics. This can include a resistance, a voltage, or a current.

In an alternative embodiment, the temperature of the heat sink junction sensor is indirectly measured by sensing a characteristic or temperature of a component that can be indicative of the temperature of the heat sink junction. By way of example, a sensor can sense a temperature of the heat sink relative to the temperature of the junction temperature. In such a case, the system can estimate the temperature of the junction between the SSR and the heat sink based on a model, an algorithm, and a look-up table or otherwise.

By determining the temperature of the heat sink junction, the power control assembly can identify a potential or pending failure of the power switch due to a breakdown in the thermal bonding or junction between the power switch and the heat sink. For example, the identification of a breakdown in the thermal bonding of an SSR to associated heat sink can be determined when a measured characteristic such as temperature is greater than a predetermined threshold.

In another embodiment, the control assembly can include an electrical monitoring apparatus or sensor monitoring an electrical characteristic of the interface between the power switch and a ground plane. Such an electrical monitoring can provide a characteristic that is indicative of a failure or pending failure of one or more components of the power control assembly. In other embodiments, an electrical connection to the heat sink and an electrical connection to another system component can be provided as a reference for a digital common, analog common, or another point. The module or component can receive electrical signals or measurements from these connections and determines the voltage between the connection points. The control module can then compare them to a predetermined value that can be zero, to determine an amount of leakage current to ground. This determination enables the self-identification by the component of a failure that results in a leakage current to ground.

For example, the power control assembly can include a failure indication module that has at least one electrical kiss-off with one or more other power system components. The kiss-off can be a contact that is compressed between two components of the system or can include a conductive spring protrusion that is biased towards a first component when the second component with the spring protrusion being pressed against a conducting element of the first component. The component providing the electrical kiss-off can be any component within the power control assembly including the controller or monitoring module. The first component that is being kissed can be any component of the control assembly and in some embodiments the kissed component can be a heat sink. In some embodiments, the kissing sensor can include an electrical connection such as to sense a voltage of the ground reference. The ground reference voltage can be indicative of a leakage current through a faulty power load such as a heater element or an electric motor. The sensed electrical characteristic can also be indicative of a breakdown or impairment of another component of the power control assembly. By way of example, this can include an indication of a grounded sensor such as a thermocouple.

As discussed, one or more components of power control assembly can include an operating environment that can include a processing system that includes at least one microprocessor and a memory. These elements are typically interconnected by at least one bus structure. The processor can be of familiar design and include an arithmetic logic unit (ALU) for performing computations, a collection of registers for temporary storage of data and instructions, and a control unit for controlling operation of the system. Any of a variety of processors, including at least those from Digital Equipment, Sun, MIPS, Analog Devices, Silicon Laboratories, NEC, Intel, Texas Instruments, Cyrix, AMD, HP, and Nexgen, is equally preferred for the processor. Embodiments of the invention can operate on an operating system designed to be portable to any of these processing platforms or can be proprietary to one or more processing platforms.

The memory can generally include high-speed main memory in the form of a medium such as random access memory (RAM) and read only memory (ROM) semiconductor devices. Other memory or data storage can also be included in some components including secondary storage in the form of long term storage mediums such as floppy disks, hard disks, tape, CD-ROM, flash memory and other devices that store data using electrical, magnetic, optical or other recording media. The memory of the user interface can also include display memory for displaying images through a display device or interface. Those skilled in the art will recognize that the memory can comprise a variety of alternative components having a variety of storage capacities.

The user interface component can comprise, by way of example, a keyboard, a button, a switch, a thumbwheel, a touchpad, a mouse, a physical transducer (e.g. a microphone), biometrics measuring devices, bar code scanner, or an interface associated with any one of these user input devices. Additionally, user interface device can also include an interface for receiving data such a communication network interface utilizing a hard wire connection or a wireless connection.

As is familiar to those skilled in the art, one of the component processing systems can further include an operating system and at least one application program. The application program can perform one or more of the monitoring, determining, or controlling functions described above. The operating system is the set of software which controls the processing system's operation and the allocation of resources. The application program is the set of software that performs one or more of the task or features described or enabled above, by using processing system resources made available through the operating system. Both are typically resident in the described memory.

In accordance with the practices of persons skilled in the art of computer programming, embodiments of the power control assembly or components thereof described above with reference to symbolic representations of operations can be performed by the processing system. Such operations are sometimes referred to as being computer-executed or computer executable instructions. It will be appreciated that the operations which are symbolically represented include the manipulation by the processing system of electrical signals representing data bits and the maintenance of data bits at memory locations in the memory system, as well as other processing of signals. The memory locations where data bits are maintained are physical locations that have particular electrical, magnetic, or optical properties corresponding to the data bits. Embodiments of the invention can be implemented in a program or programs, comprising a series of instructions stored on a computer-readable medium. The computer-readable medium can be any of the devices, or a combination of the devices, described above in connection with the memory system.

Although several power control assemblies and components and methods of operation have been illustrated in particular embodiments as the hockey puck configured solid state relay (SSR), such an illustration has only been shown by way of example, and is not intended to be limited to such embodiments. Other systems and methods consistent with the various aspects and embodiments of the invention are also contemplated within the context and aspects of the invention.

One or more embodiments of the power control assembly described herein provide for the reduced number of wire terminations that reduce the number of wire connections, reduce the potential for wiring errors, reduce the number of points of potential failure, and reduce labor required for installation and maintenance of the power control system and its components.

Additionally, the integrated nature of some embodiments also provides for the reduction in the number of components required for one or more power control applications.

In some embodiments, these reductions can provide for improved reliability, improved ease of installation, reduced installation costs, reduced maintenance requirements and cost, improved ease of component or system replacements and upgrades.

Additionally, some embodiments of the power control assembly provide for improved granularity and scalability for power control system installations. Such improved granularity and scalability will provide users with reduced costs for power control applications.

When introducing aspects of the invention or embodiments thereof, the articles "a", "an", "the", and "said" are intended to mean that there are one or more of the elements. The terms "comprising", "including", and "having" are intended to be inclusive and mean that there can be additional elements other than the listed elements.

In view of the above, it will be seen that several advantages are achieved and other advantageous results attained. As various changes could be made in the above exemplary constructions and methods without departing from the scope of the invention, it is intended that all matter contained in the above description or shown in the accompanying drawings shall be interpreted as illustrative and not in a limiting sense.

It is further to be understood that the processes or method steps described herein are not to be construed as necessarily requiring their performance in the particular order discussed or illustrated, unless otherwise noted. It is also to be understood that additional or alternative processes or method steps can be employed and still be within the scope of the invention.

What is claimed is:

1. A power control system having a plurality of components, the system comprising:
    a system control component generating a switch control signal;
    a limit control component receiving a sensed limit operating characteristic and generating a limit control signal as a function of the sensed limit operating characteristic;
    a communication link providing communication between the system control component and the limit control component; and
    a power control unit including a plurality of power control components and a unit integration coupling mechanism for mechanical and electrical coupling of the components of the power control unit, the power control unit including:
    a power supply interface for receiving power from a power supply, a power load interface for providing, at least a portion of, the received supply power to a power load,
    a power switch component selectively providing electrical energy to a load responsive to the switch control signal, the power switch component including a power switch communication interface configured to communicate with the communication link, wherein the power switch component is a solid state device, and
    a limit component selectively providing the electrical energy to the load responsive to the limit control signal, the limit component being in electrical series with the power switch component such that the electrical energy is provided to the load through both the power switch component and the limit component, wherein the limit component is a contactor or mechanical relay.

2. The system of claim 1 wherein the power controller component is configured as an integrated assembly within the power switch component.

3. The system of claim 1 wherein the power control component is position as a separate unit from the power switch component and communicates with the power switch component over at least one of a dedicated control facility and the communication link.

4. The system of claim 1, further comprising a field device associated with the power control system, the field device being selected from the group consisting of an actuator, an accelerometer, a valve positioner, a gauge including a pressure gauge, a solenoid, a power supply, a heater, a valve including a solenoid valve, a meter, a motor, a pump, a switch including a thermal switch, a fusible link, and a memory device.

5. A power control system having a plurality of components, the system comprising:
- a system control component for generating a switch control signal;
- a limit control component for receiving a sensed limit operating characteristic and generating a limit control signal as a function of the sensed limit operating characteristic;
- a communication link providing communication between the system control component and the limit control component; and
- a power control unit including a plurality of power control components and a unit integration coupling mechanism for mechanical and electrical coupling of the components of the power control unit, the power control unit including:
- a power supply interface for receiving power from a power supply, a power load interface for providing, at least a portion of, the received supply power to a power load,
- a power switch component selectively providing electrical energy to a load responsive to the switch control signal and adapted to the coupling mechanism, the power switch component including a power switch communication interface configured to communicate with the communication link, and
- a limit component selectively providing the electrical energy to the load responsive to the limit control signal, the limit component being in electrical series with the power switch component such that the electrical energy is provided to the load through both the power switch component and the limit component.

6. The system of claim 5 wherein a plurality of the power control components within the power control unit generates one or more power control operating characteristics.

7. The system of claim 6 wherein the one or more power control operating characteristics are selected from the group consisting of a resistance, a current, a voltage, a Hall effect voltage, an energy, a mass, a power including an electrical power, a capacitance, an inductance, a reluctance, a phase, a timing, a frequency, a time, a mode, a status, a failure, a position, an alert, an alarm, a state, a magnetic intensity, data, and a parameter.

8. The system of claim 5 wherein a plurality of the power control components within the power control unit generates a self-identification message over the communication link.

9. The system of claim 5, further comprising an intra-component diagnostics module.

10. The system of claim 5, further comprising an inter-component diagnostics module for diagnosing an operating event of the power control system.

11. The system of claim 5, further comprising a system diagnostic module including a system diagnostic parameter selected from the group consisting of a diagnostic, a calibration, a profile, a configuration, a system administration, a system operation, an operating characteristic, an event, a status, a failure, a mode, and a state.

12. The system of claim 5, further comprising a system diagnostic module including a diagnostic function selected from the group consisting of an algorithm, a program, an artificial intelligence module, a modeling module, a mapping, a graphical analysis, a rule, a comparator, and a look-up table.

13. The system of claim 5, further comprising a system diagnostic module including a diagnostic function selected from the group consisting of a neural network, an empirical data, a numerical data, a fuzzy logic circuit, a neural fuzzy circuit, a polynomial algorithm, a residual life algorithm, an artificial intelligence module, a modeling module, and a statistical function.

14. The system of claim 5, further comprising an operational monitoring system monitoring an occurrence associated with one or more operating events selected from the group consisting of a change of a state, a change of a mode, a change of a status, a failure, a change of a field parameter, a change of the field operating characteristic, a value of a field parameter exceeding a threshold, an alarm, an alert, and a value of the field operating characteristic exceeding a threshold.

15. The system of claim 5 wherein the power control unit further comprises a load sensor for sensing an operating characteristic of the power load.

16. The system of claim 5 wherein the power control unit further comprises a power measurement component and sensor for sensing at least a voltage and a current.

17. The system of claim 5 wherein the power switch component includes a switch device selected from the group consisting of a contactor, a relay, a solid state device, a knife switch, a mercury switch, and a cam switch.

18. The system of claim 5 wherein the system includes a plurality of power control units, each of which communicates with the system control component and between each other over the communication link.

19. The system of claim 5, further comprising a communication interface for communicating between a plurality of power control systems and with a power control management or administration system.

20. The system of claim 5, further comprising an communication interface for communicating with an external system selected from the group consisting of a power control management a fabrication system, a manufacturing system, an assembly system, a processing system, an operational control system, an asset management system, a maintenance system including a predictive maintenance system, and a supervisory control and data acquisition (SCADA) system.

21. The system of claim 5 wherein the integrated coupling mechanism provides at least one of inter-component association and inter-component alignment.

22. The system of claim 5 wherein one or more components of the power control unit includes a processing system for performing an system or unit operating process selected from the group consisting of a diagnostics, a trouble shooting method, a fault detection, a fault isolation, a root cause, a setting, a limit, a threshold, a calibration, a failure prediction, a maintenance procedure, a validation, a verification, a traceability, an auto-configuration, an architecture alignment, a fingerprint, an identification, a theoretical modeling, a self-administration, and a self-tuning rule.

23. The system of claim 5 wherein the power control unit includes a function selected from the group consisting of a thermal protection, status indication, and zero cross detection.

24. The system of claim 5 wherein the power switch component is a solid state device.

25. The system of claim 24, wherein the limit component is a contactor or mechanical relay.

* * * * *

UNITED STATES PATENT AND TRADEMARK OFFICE
CERTIFICATE OF CORRECTION

| | | |
|---|---|---|
| PATENT NO. | : 7,636,615 B2 | Page 1 of 1 |
| APPLICATION NO. | : 11/219473 | |
| DATED | : December 22, 2009 | |
| INVENTOR(S) | : Thomas Robert Pfingsten et al. | |

It is certified that error appears in the above-identified patent and that said Letters Patent is hereby corrected as shown below:

Claim 3, Column 41, Line 9, immediately after "component is" delete "position" and substitute --positioned-- in its place.

Claim 20, Column 42, Line 49, immediately after "further comprising" delete "an" and substitute --a-- in its place.

Claim 22, Column 42, Line 62, immediately after "performing" delete "an" and substitute --a-- in its place.

Signed and Sealed this

Thirteenth Day of July, 2010

David J. Kappos
*Director of the United States Patent and Trademark Office*